United States Patent
Seki et al.

(10) Patent No.: US 7,756,403 B2
(45) Date of Patent: Jul. 13, 2010

(54) HEATING PROCESS OF THE LIGHT IRRADIATION TYPE

(75) Inventors: Kyohei Seki, Himeji (JP); Shinji Suzuki, Tokyo-to (JP); Yoichi Mizukawa, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 757 days.

(21) Appl. No.: 11/536,057

(22) Filed: Sep. 28, 2006

(65) Prior Publication Data

US 2007/0071906 A1 Mar. 29, 2007

(30) Foreign Application Priority Data

Sep. 28, 2005 (JP) ............................. 2005-281569

(51) Int. Cl.
*A45D 20/40* (2006.01)

(52) U.S. Cl. .................... 392/407; 392/408; 392/411

(58) Field of Classification Search ................ 392/407
See application file for complete search history.

(56) References Cited

U.S. PATENT DOCUMENTS 4,859,832 A 8/1989 Uehara et al.

7,038,174 B2 * 5/2006 Gat et al. .................... 219/390
2004/0112885 A1 6/2004 Shigeoka et al.

FOREIGN PATENT DOCUMENTS

| JP | 62020308 A | 1/1987 |
| JP | 63260127 A | 10/1988 |
| JP | 2940047 B2 | 6/1999 |

* cited by examiner

*Primary Examiner*—Thor S Campbell
(74) *Attorney, Agent, or Firm*—David S. Safran; Roberts Mlotkowski Safran & Cole, P.C.

(57) ABSTRACT

A light irradiation heating process in which, even in the case of an asymmetrical physical property of an article to be treated, uniform heating is possible, or in which heating can be performed such that the article acquires a desired physical property after heat treatment. Based on the measured value of the local physical property of the article to be treated, the emissivity distribution is obtained and the distribution pattern of the light intensity on the article to be treated is determined. According to this light intensity pattern, the individual intensity of the light emitted from respective light emitting parts of lamp units of the heating device are determined beforehand. According to this determined result, the intensity of the light emitted from the respective light emitting parts of the lamp units are controlled individually, and thus, the article to be treated is irradiated with light.

7 Claims, 19 Drawing Sheets

Article to be treated

HEATING PROCESS OF THE LIGHT IRRADIATION TYPE

BACKGROUND OF THE INVENTION

1. Field of the Invention

The invention relates to a heating process of the light irradiation type in which the article to be treated is heat-treated by light irradiation of the article to be treated using a heating device of the light irradiation type.

2. Description of Related Art

In semiconductor production, heat treatment is generally used for different processes such as film formation, oxidation diffusion, diffusion of impurities, nitriding, film stabilization, silicide generation, crystallization, ion implantation activation and the like.

To improve yield and quality in semiconductor production, rapid thermal processing (RTP) is desirable, in which the temperature of the article to be treated, such as a semiconductor wafer or the like, is rapidly raised or lowered. In RTP, a heat treatment device of the light irradiation type using light irradiation with a light source such as a filament lamp or the like is widely used.

A filament lamp in which there is a filament within the bulb of transparent material, is a typical lamp in which light can be used as heat since, in this connection, greater than or equal to 90% of the input power is radiated, and since heating is possible without contact with the article to be treated.

In the case of using such a filament lamp as the heat source for heating a glass substrate and a semiconductor wafer, the temperature of the article to be treated, compared to a resistance heating process, can be raised/lowered more rapidly. This means that the temperature of the article to be treated can be increased, for example, to at least 1000° C. in a few seconds to a few dozen seconds by heat treatment of the light irradiation type. After light irradiation has been stopped, the article to be treated is rapidly cooled. This heat treatment of the light irradiation type is normally performed several times.

If, in this connection, the article to be treated is, for example, a semiconductor wafer of monocrystalline silicon, when the semiconductor wafer is heated to at least 1050° C., if in the temperature distribution of the semiconductor wafer a nonuniformity appears, there is a possibility that in a semiconductor wafer a phenomenon called slip, i.e., a defect of crystal transition, arises, resulting in that inferior goods will be formed. Therefore, when RTP of the semiconductor wafer is performed using a heat treatment device of the light irradiation type, heating, holding at a high temperature and cooling must be performed in such a way that the temperature distribution on the entire surface of the semiconductor wafer becomes uniform. This means that, in RTP, there is a demand for very accurate temperature uniformity of the article to be treated. One example of a conventional heating device of the light irradiation type with consideration of the temperature uniformity of the article to be treated in heat treatment is described in Japanese patent disclosure documents JP SHO 62-20308 A and JP SHO 63-260127 A which corresponds to U.S. Pat. No. 4,859,832.

In the heating device of the light irradiation type of JP SHO 62-20308 A, the heating means is a light irradiation means formed, for example, of several halogen lamps arranged parallel to one another. These halogen lamps are divided into groups of a few lamps, each group is assumed to be a unit of control and the heat output from each group is controlled independently of one another. The temperature of several points of the article to be treated is detected with a radiation thermometer and the above described unit of control is controlled based on this detection result such that the temperature of the article to be treated becomes uniform.

In the heating device of the light irradiation type of JP SHO 63-260127 A and U.S. Pat. No. 4,859,832, the heating means is a light irradiation means formed, for example, of several annular infrared lamps of different diameters that are arranged concentrically with respect to each other. The controller of this heating device of the light irradiation type determines data beforehand of the type of lighting control of the IR lamps required to make the temperature distribution of the article to be treated uniform to a given temperature for the given the different temperature distribution patterns of the article to be treated. Thus, a tabular outline of the "Patterns of the respective temperature distribution against patterns of lighting control of IR lamps" is stored.

During heat treatment, at least two points of the article to be treated are measured with a radiation thermometer, and the patterns of the temperature distribution are determined. The controller finds the pattern of the temperature distribution as near as possible to the measured pattern of the temperature distribution from the stored tabular outline and controls the IR lamps, as the heating means, based on the pattern of lighting control of the IR lamps which corresponds to the most similar pattern of the temperature distribution, so that the temperature of the article to be treated becomes uniform.

The light irradiation means serving as the heating means of the heating device of the light irradiation type described in Japanese patent disclosure document JP 2002-203804 A and corresponding U.S. Pat. No. 6,876,816 has a first lamp unit and a second lamp unit. In the first lamp unit, there are several U-shaped, double-end lamps arranged in the parallel and perpendicular directions with respect to the page of drawings, in which there are feed devices for the filaments on the two ends of the bulb. In the second lamp unit, there are several straight, double-end lamps arranged in perpendicular directions with respect to the page of drawings, in which there are feed devices for the filaments on the two ends of the bulb. The second lamp unit is located underneath the first lamp unit. The article to be treated is heated by the light irradiation to the article to be treated, such as a semiconductor wafer or the like which is located underneath the above described second lamp unit.

In the heating process described in JP 2002-203804 A (U.S. Pat. No. 6,876,816), the heating region of the semiconductor wafer as the article to be treated is divided into several zones which are centrosymmetric 1 and concentric. By combining the distribution of light intensities of the respective lamps of the first and second lamp units with one another, synthetic light intensity distribution patterns are formed which correspond to the respective zone and which are centrosymmetric to the middle of the semiconductor. Thus, heating is performed according to the temperature change of the respective zone measured with the radiation thermometer. In this connection, the semiconductor wafer which constitutes the article to be treated is turned to suppress the effect of variations of the illuminance of the radiation of the lamps. This means that the respective, concentrically arranged zone can be heated at an individual illuminance.

In Japanese patent disclosure document JP HEI 3-218624 A (JP 2940047 B2), a device using single-end type halogen lamps is described in which, according to the thermal radiation characteristic of the respective part of the article to be heated, the amount of IR irradiation of the lamps which are opposite the respective part is set such that the amount of heat radiation thereof is supplemented.

For all heat treatments of the light irradiation type which are described in the above described publications, the temperature of the article to be treated is monitored and the emission of the lamps of the heating means of the light irradiation type is controlled based on the monitoring result, such that the temperature of the article to be treated becomes uniform. Therefore, for example, even in the vicinity of the edge area of the article to be treated, which is in contact with the treatment table which supports the article to be treated and in which a temperature drop often occurs by heat radiation, by controlling the emission intensity of the lamps which correspond to the edge area, a constant temperature distribution of the article to be treated can be accomplished.

However, it has been found that, in the above described conventional heating devices of the light irradiation type, the following disadvantages occur.

When the article to be treated is a semiconductor wafer, for example, generally, a film of metal oxide, metal nitride or the like is formed on the surface of semiconductor wafer by sputtering on or the like or impurities additive are doped by ion implantation. In this connection, local distributions on the wafer surface are formed in the surface conditions of the semiconductor wafer by film formation or in the density of the dopant ions which are implanted in the ion implantation process. These distributions are not always centrosymmetric relative to the center of the semiconductor wafer, but rather are asymmetrical to the center of the semiconductor wafer. When a distribution of the surface conditions of the semiconductor wafer arises, a distribution of emissivity on the semiconductor wafer surface is formed. The amount of light absorption of the material which is irradiated with light depends on the emissivity of the material. The temperature of the semiconductor wafer therefore has a local distribution even if, for example, irradiation and heating are performed with light such that the surface of the semiconductor wafer has a uniform intensity distribution.

The factor of formation of the above described local distribution of the surface properties of the semiconductor wafer results from, for example, different film types being formed on the surface of the semiconductor wafer. If, for example, a case is imagined where the semiconductor wafer is formed of monocrystalline silicon, according to the construction of the semiconductor device in the region of the surface of the semiconductor wafer, a $SiO_2$ film is formed, while in another area thereof, a SiN film is formed and in a still further area, no film is formed. If the types of locally formed films differ in this way, the emissivity differs in each film formation area.

Furthermore, for example, even for the same film type, according to the film formation conditions in one region a dense film with a mirror-like surface is formed, while in another region a film is formed with a porous surface. Even if only these surface conditions of the film differ from one another, the emissivities differ from one another.

On the other hand, the emissivities differ from one another in the same way as in the above described different surface conditions of the semiconductor wafer, when the dopant ion density in the surface layer of the ion implanted workpiece in the ion implantation process differs. This means that, according to the local distribution of the density of dopant ions on the semiconductor wafer surface, a local distribution of emissivity occurs. As in the above described case of the presence of a distribution of surface conditions of the semiconductor wafer, the semiconductor wafer temperature has a local distribution even if, for example, irradiation and heating are performed with light such that the surface of the semiconductor wafer has a uniform light intensity distribution.

In the heating device of the light irradiation type described in JP SHO 62-20308 A and JP SHO 63-260127 A (U.S. Pat. No. 4,859,832), in each case, the light irradiation means as the heating means are arranged symmetrically to one another. In the heating device of the light irradiation type described in JP SHO-62-20308 A, groups of a few halogen lamps that are the units of the control are arranged centrosymmetrically. In the heating device of the light irradiation type described in JP SHO 63-260127 A (U.S. Pat. No. 4,859,832), the light irradiation means is arranged such that several annular IR lamps with different diameters are concentrically arranged.

Therefore, the distribution pattern of the light intensity on the article to be treated can be established only symmetrically to its shape, even if according to the temperature distributions which have been measured and obtained with a radiation thermometer at several points, lighting control of the respective lamp is attempted. Therefore, in practice it is difficult to heat-treat an article to be treated like the above described semiconductor wafer with a temperature property asymmetrical to the shape of the article to be treated, with a uniform temperature.

On the other hand, in the heating device of the light irradiation type described in JP 2002-203804 A (U.S. Patent Application Publication 2004/0112885 A1), for light irradiation, as the heating means there are several U-shaped, double-end lamps, in which on the two ends of the bulbs there are feed devices for the filaments, arranged parallel and perpendicular to the page of the drawings, synthetic light intensity distribution patterns which are centrosymmetric to the center of the semiconductor wafer are formed which correspond to the respective concentric zones as the heating region of the semiconductor wafer and are centrosymmetric to the center of the semiconductor, and heating is performed according to the temperature distribution of the respective zone.

But since the above described synthetic light intensity distributions are centrosymmetric relative to the center of the semiconductor wafer and since the semiconductor wafer is itself turning, as a result, in practice, it is difficult to heat-treat an article to be treated with a temperature property asymmetrical to its shape, with a uniform temperature.

In the heat treatment of the light irradiation type described in all the aforementioned publications, a radiation thermometer is used in each case for temperature measurement. Assuming that the temperature of the measured object is the same at each point, the same temperature is shown when the emissivity of the measurement points is the same. However, if the article to be treated is a semiconductor wafer, as was described above, the semiconductor wafer has a local distribution of emissivity. Even if the true temperature of the wafer were to be, for example, uniformly at 1050° C., due to the different emissivities, certain points have a measured value of 1055° C. and other points have a measured value of 1045° C., etc. Therefore, the lamp control system which is connected to the respective radiation thermometer, due to the above described apparent measurement result, carries out control with feedback so that, if control is set to uniform control at 1050° C., for example, the lamp control system which corresponds to points with 1055° C. reduces the power supplied to the lamp, while the control system which corresponds to the points with 1045° C. increases the power supplied to the lamp, so that in this way control is exercised such that the apparent temperature measurement value of the respective radiation thermometer is set to 1050° C. As a result, the real temperature of the points with lower emissivity becomes high and the real temperature of the points with a higher emissivity becomes low. This means that, during heat treatment, a temperature distribution is formed, and under certain circumstances, there is a possibility that slip will occur in the semiconductor wafer, and thus, inferior goods will be formed.

In the heat treatment of the light irradiation type described in the aforementioned publications, in any case, the purpose is to make the temperature of the article to be treated uniform in heat treatment. Therefore, when this heat treatment is performed, the following disadvantages can occur.

When the article to be treated is, for example, a semiconductor wafer, generally, as was described above, impurities additive are doped on the surface of the semiconductor wafer by ion implantation, and the local distribution of the density of dopant ions on the surface of the semiconductor wafer is asymmetrical to the center of the semiconductor wafer.

If, in this connection, based on the conventional heat process, the semiconductor wafer is heated and activated such that the temperature of the article to be treated is uniform, according to the distribution of the density of dopant ions, a distribution also occurs in the carrier concentration. This means that the points with a high density of dopant ions have a higher carrier concentration and a lower sheet resistance value. On the other hand, the points with the low density of dopant ions have a lower carrier concentration and a higher sheet resistance. The local electrical property of the semiconductor wafer therefore varies, by which it becomes difficult to obtain a uniform electrical property.

In the case of film formation by heating the surface of the semiconductor wafer, film formation is performed by heating the semiconductor wafer by light irradiation by allowing a raw gas to flow as the film material on the surface of the semiconductor wafer. In this connection, the distribution of the gas flow of the raw gas on the surface of the semiconductor wafer is not uniform. If, in this state, the semiconductor wafer is heated with a conventional heat process and thus film formation is accomplished such that the temperature of the article to be treated is uniform, therefore a local distribution occurs in the composition of the film formed on the semiconductor wafer and in its film thickness. As a result, variations of the electrical property of the semiconductor wafer, and consequently, variations in the device characteristic occur.

The above described disadvantages are difficult to eliminate by conventional heat treatment which is intended to make the temperature of the article to be treated uniform.

SUMMARY OF THE INVENTION

The invention was devised to eliminate the above described disadvantages in the prior art. The first object of the invention is to devise a heating process in which uniform heating of an article to be treated is possible even in the case of an asymmetrical physical property of the article to be treated with reference to its shape.

The second object of the invention is to devise a heating process in which an article to be treated and in which disadvantages in its physical properties occur due uniform heating, can be heated without producing disadvantages in the physical properties such that the article to be treated acquires the desired physical properties after heat treatment.

These objects are achieved in accordance with the invention in a heating process of the light irradiation type in which, using a heating device of the light irradiation type which has at least one group of lamp units with at least one light emitting part and in which the intensity of the light emitted by the respective light emission part can be individually controlled, the article to be treated is heated by light irradiation, in that the local distribution of a physical property of the article to be treated or the local distribution of a physical property of the raw material molecules in a space between the above described light emitting parts and the article to be treated is measured beforehand, that based on this measured value the pattern of the distribution of the light intensity on the article to be treated which is necessary for this purpose is determined, that the article to be treated by light heating acquires the desired physical properties, that according to this pattern of light intensity, the individual intensity of the light emitted by the above described at least one light emitting part is determined beforehand, and that according to this determined result, the intensity of the light emitted by the respective light emitting part is controlled individually and the article to be treated is irradiated with light, as is described in the following (1) to (3).

(1) In the first heating process of the invention, the local distribution of a physical property of the article to be treated, such as the distribution of the surface conditions or the distribution of the density of the implanted dopant ions which have conventionally never been considered in a heating process, is measured beforehand, the distribution pattern of the light intensity on the article to be treated is set at which the temperature of the article to be treated during light irradiation becomes essentially uniform, and the article to be treated is subjected to heat treatment of the light irradiation type such that the set distribution pattern of light intensity is maintained.

In this connection, the above described local distribution of a physical property means, for example, the distribution of emissivity of the article to be treated. Based on the measurement result of the distribution of the emissivity, the distribution pattern of light intensity on the article to be treated is set such that the entire surface of the article to be treated is subjected to uniform heat absorption and that the temperature distribution of the article to be treated during light irradiation is kept essentially uniform.

(2) In the second heating process of the invention, the local distribution of a physical property of the article to be treated is measured beforehand, based on this measurement result the distribution pattern of the light intensity on the article to be treated, is set such that the heated article to be treated acquires essentially uniform electrical or physical properties, and the article to be treated is subjected to heat treatment of the light irradiation type, such that the set distribution pattern of light intensity is maintained.

The above described local distribution of a physical property means the distribution of the density of dopant ions which have been implanted, for example, by an ion implantation process in the article to be treated before heating. Based on the measurement result of the above described distribution of dopant ions, the distribution pattern of the light intensity on the article to be treated is set such that the temperature distribution of the article to be treated during light irradiation for a given distribution is maintained and that after light heating treatment the physical property that the sheet resistance within the surface of the article to be treated is uniform is given.

In the aforementioned items (1) and (2) the local distribution of the physical property of the article to be treated which is to be measured beforehand can be collected for the individual article to be treated, or when collection of the data of the local distribution of the physical properties in batches is not a problem, can be collected for an arbitrary one of the articles to be treated of a lot.

(3) In the third heating process of the invention, the local distribution of a physical property of the raw material molecules is measured in the space between the light emitting parts and the article to be treated, based on this measured value, the pattern of the distribution of the light intensity is determined on the article to be treated which is necessary for the article treated by light heating to acquire the desired physical property, and according to this pattern of the light intensity, the article to be treated is heated by light irradiation.

The local distribution of a physical property of the raw material molecules in the space between the above described light emitting parts and the article to be treated means a gas distribution of, for example, a reactant gas for film formation with a distribution which is determined by the measurement of the distribution of the film thickness of the film which has been formed on the surface of the dummy article. Based on this film thickness distribution, a distribution pattern of the light intensity is established on the article to be treated which is necessary to make uniform the thickness distribution of the film which is formed on the surface of the light-heated article.

The thickness distribution of the film which has been formed in the surface of the above described dummy article is measured specifically as follows:

Several articles to be treated as dummies are placed in the reactant gas for film formation are heated under conditions of essentially the same location and position and a uniform temperature distribution for different temperatures individually and a film is formed in the respective dummy article to be treated; and The thickness distribution of the film formed on the surface of the dummy article is measured.

At this point, the respective film formation rate at any identical location of the respective dummy article is measured, based on this respective measured film formation rate, the temperature dependency of the film formation rate of any identical location of the article to be treated which is placed in the reactant gas for film formation is determined, and based on the above described film thickness distribution and the temperature dependency of the above described film formation rate, the distribution pattern of the light intensity is determined on the article to be treated which is used to make uniform the film thickness distribution of the film to be formed on the surface of the article to be treated which is placed in the reactant gas for film formation. According to this pattern of light intensity, the individual intensity of the light emitted from the above described at least one light emitting part is determined beforehand. According to this determined result, the intensity of the light emitted by the respective light emitting part is controlled individually and the respective article to be treated is irradiated with light.

Action of the Invention

In accordance with the invention, the following effects are obtained.

(1) In the first heating process of the invention, the local distribution of a physical property of the article to be treated is measured beforehand, the distribution of the emissivity is determined, based on this distribution of the emissivity the distribution pattern of the light intensity on the article to be treated is set at which the temperature of the article to be treated during light irradiation is made essentially uniform, and the article to be treated is heat-treated by light irradiation. Therefore, as compared to a conventional heating process, it becomes possible to make the temperature of the article to be treated uniform during light irradiation with high precision. Thus, after heating, the article can be imparted the desired physical property.

There many are cases in which the local distribution of the physical property for the article to be treated is asymmetrical to its shape. However, in the heating process in accordance with the invention, heating is performed using a heat treatment device of the light irradiation type which has lamp units with at least one light emitting part in which the intensity of the light emitted by the respective light emitting part can be controlled individually, and which is designed to be able to set the light intensity distribution on the article to be treated asymmetrically with respect to its shape. Therefore, it is also possible to suitably handle the local distribution of the physical property which is asymmetrical to the shape of the article to be treated.

Furthermore, in the case of temperature measurement using a radiation thermometer, a temperature measurement error arises as a result of a nonuniform distribution of the emissivity. However, in accordance with the invention the distribution pattern of the light intensity on the article to be treated is set based on the distribution of the emissivity at which the temperature of the article to be treated during light irradiation is made essentially uniform, and thus, light irradiation is performed. Therefore, the disadvantage as a result of the measurement error of the radiation thermometer is avoided.

(2) In the second heating process of the invention, the local distribution of a physical property of the article to be treated is measured beforehand, based on this measurement result, the distribution pattern of the light intensity on the article to be treated is set such that the heat-treated article acquires an essentially uniform electrical or physical property, and thus, the article to be treated is subjected to heat treatment of the light irradiation type. This enables the heat-treated article to acquire essentially uniform or desired electrical or physical properties.

Furthermore, since a heat treatment device of the light irradiation type is used with the function of being able to set the light intensity distribution on the article to be treated asymmetrically with respect to its shape, it is possible to suitably handle the local distribution of the physical property which is asymmetrical to the shape of the article to be treated.

(3) In the third heating process of the invention, the local distribution of a physical property of the raw material molecules is measured in the space between the light emitting parts and the article to be treated, based on this measured value, the distribution pattern of the light intensity is determined on the article to be treated which is necessary to impart the desired physical property to the light-heated article, and the article to be treated is subjected to heat treatment of the light irradiation type. Therefore, even in the case of a nonuniform local distribution of the physical property of the raw material molecule in the space between the light emitting parts and the article to be treated, it becomes possible to suppress the disadvantage of variations of the electrical property of the heat-treated article and the resulting disadvantage of variations in the device characteristic. In the case, for example, of a nonuniform gas flow distribution of the raw gas on the surface of the semiconductor wafer which constitutes the article to be treated, a local distribution is formed in the composition of the film formed on the semiconductor wafer and in its film thickness when the semiconductor wafer is heated based on the conventional heating process such that the temperature of the article to be treated becomes uniform, and film formation is performed.

In the third heating process of the invention, in the above described case of a nonuniform gas flow distribution of the raw gas, therefore, the procedure is as follows.

In a given raw gas feed atmosphere, several dummy articles to be treated are heated with a uniform temperature distribution to different temperatures and subjected to film formation. The data of the film formation distribution and the temperature dependency of the film formation rate are determined. Based on these values, the distribution pattern of the light intensity on the article to be treated is set such that, on the heat-treated article, a film with an essentially uniform film thickness and composition is formed. Heat treatment of the light irradiation type of the article to be treated is performed such that the set distribution of the light intensity is maintained. This heat treatment makes it possible to suppress the disadvantage of variations of the electrical properties of the semiconductor wafer, specifically the heat-treated article, and the resulting disadvantage of variations in the device characteristic.

The invention is further described below with reference to the drawings.

DETAILED DESCRIPTION OF THE INVENTION

Preferred embodiments of the invention which however are not intended to limit it are described below by way of example.

A. Arrangement of the Heating Device

First, the arrangement of one example of a heating device used for a heating process in accordance with the invention is described.

Figure 1:
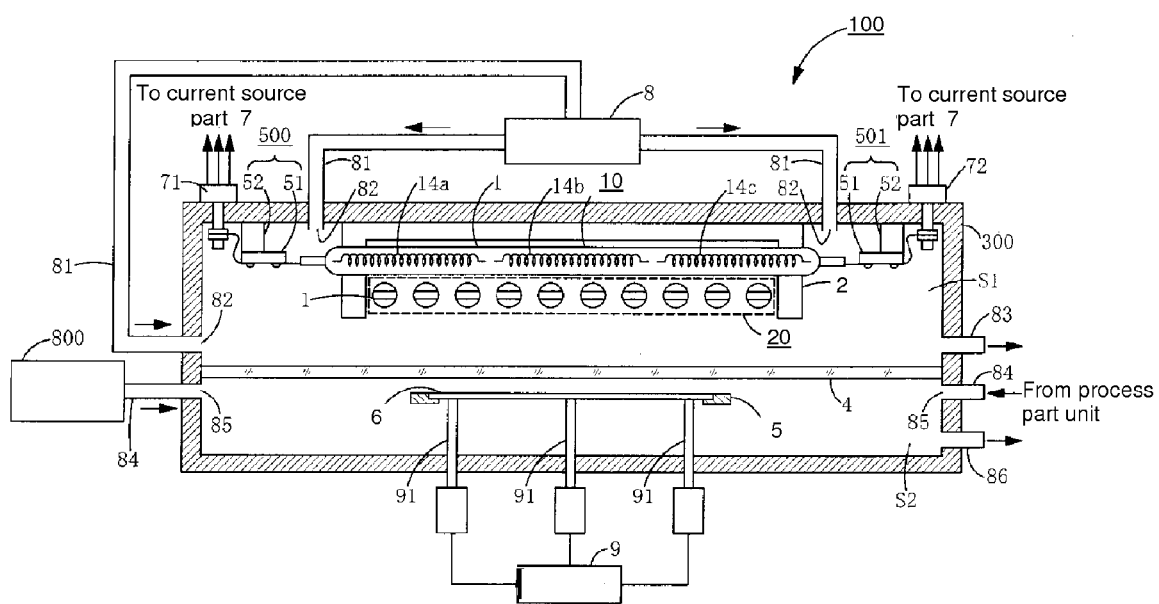
FIG. 1 shows a schematic cross-sectional view of the arrangement of one example of a heating apparatus which is used for the heating process in accordance with the invention.

FIG. 1 shows a schematic of the arrangement of a heating device 100 which has a chamber 300 with an inside divided by a silica glass window 4 into a lamp unit holding space S1 and a heat treatment space S2. Light which is radiated from the first lamp unit 10 and a second lamp unit 20, which are arranged in the lamp unit holding space S1, is irradiated via the silica glass window 4 onto the article 6 which is to be treated, which is located in the heat treatment space S2, and which is thus heat-treated.

Figure 12:
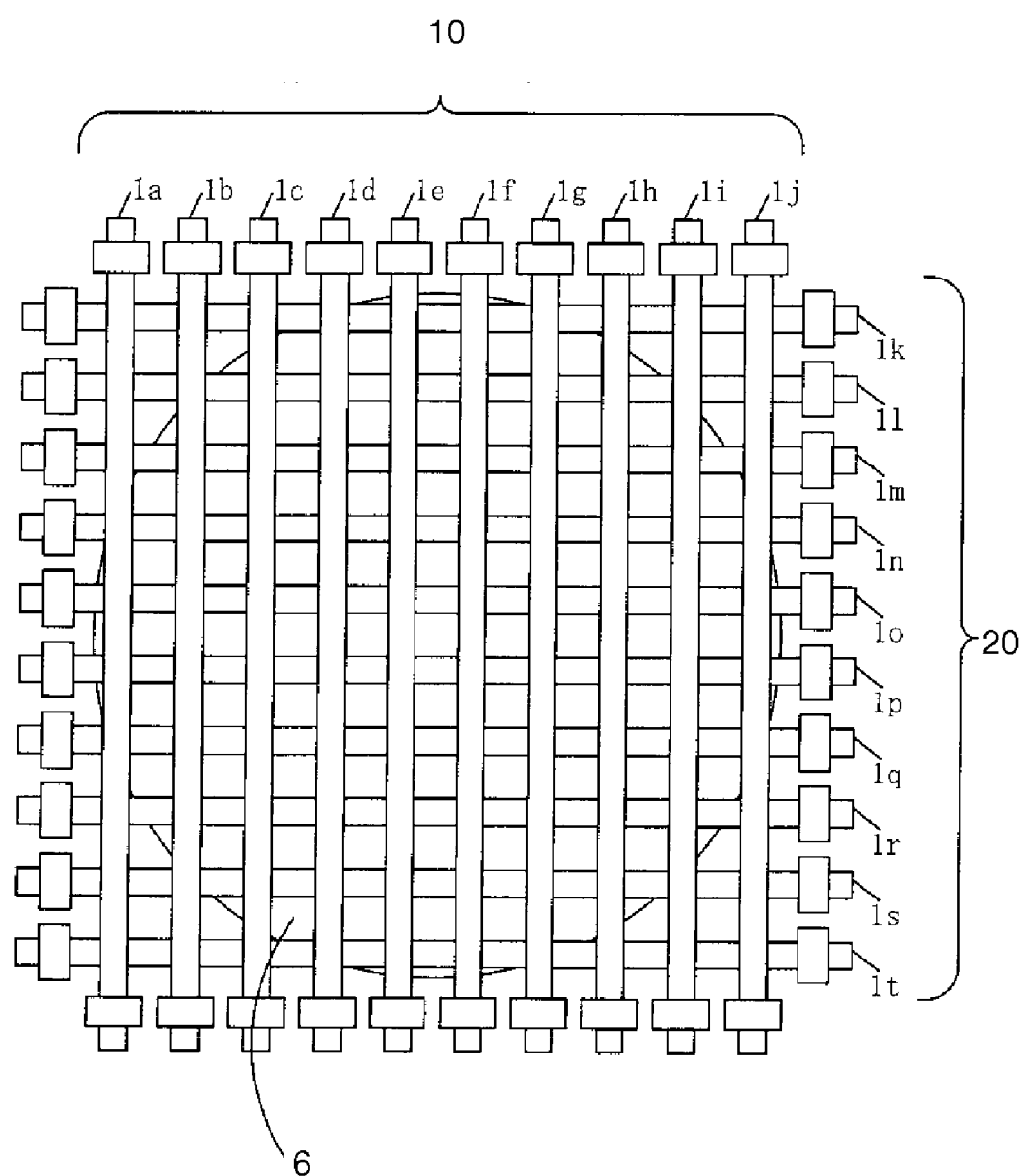
FIG. 12 is a top view of the arrangement of a first lamp unit and a second lamp unit as shown in FIG. 1.

The first lamp unit 10 and the second lamp unit 20 arranged in the lamp unit holding space S1 each comprise, for example, ten filament lamps 1 in the form of rod-shaped tubes that are arranged parallel to one another at given distances from each other. The two lamp units 10, 20 are arranged opposite each other with the axial direction of the filament lamps 1 in the form of rod-shaped tubes of the lamp unit 10 crossing the axial direction of the filament lamps 1 in the form of rod-shaped tubes of the lamp unit 20, as is shown in FIG. 12.

In the lamp units 10, 20 of the heating device used for the heating process in accordance with the invention, filament lamps with several light emitting parts are arranged parallel to one another, for example, with given intervals.

Figure 2:
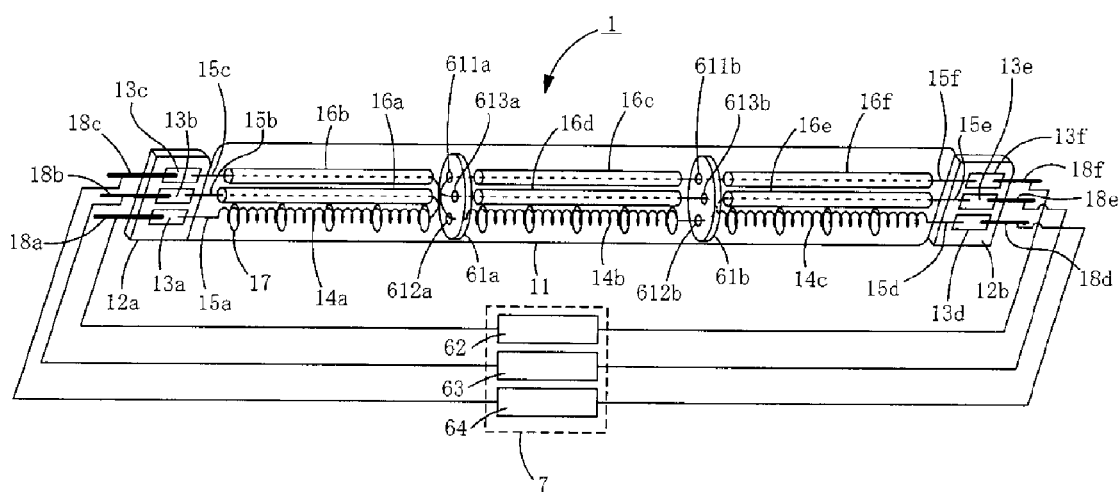
FIG. 2 is a schematic perspective view of lamp details of the heating apparatus.

In this connection, a filament lamp 1 of the lamp unit 10 and the lamp unit 20 can also be a heating apparatus in which a filament located within a rod-shaped bulb is divided into several parts and for which the respective filament can be supplied power independently of the others, as proposed, for example, by the applicant in Japanese Patent Application 2005-057803 (corresponding to European Patent Application No. 06003999.7 and U.S. patent application Ser. No. 11/362,788, which is assigned to the assignee of the present application and is hereby incorporated by reference). The respective heating apparatus of the lamp unit 10 and lamp unit 20 have a filament lamp arrangement of rod-shaped tubes and further at least one essentially coaxially arranged light emitting part. Because each filament emits individually as the light emitting part of the respective heating apparatus and because independent control of the power supplied to the filament of the respective heating apparatus is possible, the distribution of the light intensity on the article 6 to be treated can be set at will, and moreover, with high precision. FIG. 2 shows an example of a filament lamp 1 (hereinafter also called the heating apparatus) which has three filaments 14a, 14b, 14c.

In this connection, at least one light emitting part of the respective heating apparatus 1 with a rod-shaped filament lamp arrangement need not always be essentially coaxial. This means that it is not necessary for the at least one light emitting part of the respective heating apparatus to be essentially coaxially arranged. However, if at least one of the respective light emitting part is essentially coaxially arranged, an arrangement in the form of a rod-shaped tube of the respective heating apparatus is enabled, so that a simple arrangement of the respective heating apparatus for the lamp units and a relatively short distance between the heating apparatus can be easily obtained. This means that for a filament lamp arrangement, a so-called double-end lamp arrangement of the rod-shaped tube type is desired in which the bulb has the shape of a rod-shaped tube and the feed devices for the filaments are attached to the two ends of the rod-shaped tube.

This heating device with lamp units with at least one light emitting part in which the intensity of the light emitted by the respective light emitting part can be controlled individually is not limited to the above described arrangement. For example, a heating device with a lamp housing can be used in which there are several halogen lamps located next to one another, in which there is a filament in a U-shaped tube, as was described in JP 2002-203804 A (U.S. Pat. No. 6,876,816). Furthermore, a heating device can be used with a lamp housing in which there are several halogen lamps of the single-end type located next to one another, as is described in JP HEI 3-218624 A (JP 2940047 B2).

FIG. 2 shows the arrangement of details of the heating apparatus 1 proposed by the applicant in the above-mentioned Japanese patent application 2005-057803 (European patent application No. 06003999.7; U.S. patent application Ser. No. 11/362,788). As is shown in FIG. 2, the bulb 11 of the heating apparatus 1 has a pinch seal on one end that forms a hermetically sealed portion 12a, and a hermetically sealed portion 12b on the other end. The inside of the bulb 11 is hermetically sealed. The pinch sealing takes place, in this connection, such that metal foils 13a, 13b, and 13c are installed in the hermetically sealed portion 12a and metal foils 13d, 13e, and 13f are installed in the hermetically sealed portion 12b. Outer leads 18a, 18b, 18c, 18d, 18e, and 18f are electrically connected to the metal foils 13a, 13b, 13c, 13d, 13e, and 13f respectively, and in the bulb 11 there are three filaments 14a, 14b, 14c in rows essentially along the center axis of the bulb 11. Between the filaments 14a, 14b there is an insulator 61a. Between the filaments 14b, 14c there is an insulator 61b. A feed line 15a is electrically connected to one end of the filament 14a and is connected to the metal foil 13a. On the other hand, a feed line 15f is electrically connected to the other end of the filament 14a and is connected to the metal foil 13f. In this connection, the feed line 15f is arranged such that it passes through an through opening 611a located in the insulator 61a, an insulating tube 16c opposite the filament 14b, an through opening 611b located in the insulator 61b and an insulating tube 16f opposite the filament 14c in succession.

A feed line 15b is electrically connected to one end of the filament 14b and is connected to the metal foil 13b. On the other hand, the feed line 15e is electrically connected to the other end of the filament 14b and is connected to the metal foil 13e. In this connection, the feed line 15b is arranged such that it passes through an through opening 612a located in the insulator 61a and an insulating tube 16a opposite the filament 14a. The feed line 15e is arranged such that it passes through a through opening 612b located in the insulator 61b and an insulating tube 16e opposite the filament 14c. A feed line 15c is electrically connected to one end of the filament 14c and is connected to the metal foil 13c. On the other hand, the feed line 15d is electrically connected to the other end of the filament 14c and is connected to the metal foil 13d. In this connection, the feed line 15c is arranged such that it passes through a through opening 613b located in the insulator 61b, an insulating tube 16d opposite the filament 14b, an through opening 613a located in the insulator 61a and an insulating tube 16b opposite the filament 14a in succession. The filaments 14a, 14b, and 14c are supported by anchors 17 which are arranged at several points in the axial direction of the bulb 11. The anchors 17 are clamped between the inside wall of the bulb 11 and the insulating tubes 16a, 16d and 16e, and thus, are held.

For the heating apparatus 1, between the outer leads 18a, 18f, a first feed device 62 is connected, between the outer leads 18b, 18e, a second feed device 63 is connected, and between the outer leads 18c, 18d, a third feed device 64 is connected. This means that the filaments 14a, 14b, 14c, are supplied power independently of one another by the feed devices 62, 63, 64 which are independent of one another. The feed devices 62, 63, 64, are variable power supplies with a feed amount which can be controlled as required. The respective feed device can supply a DC power or an AC power to the filament.

For the heating apparatus 1 as shown in FIG. 2, the three filaments 14a, 14b, 14c can be supplied power independently of one another by the feed devices 62, 63, 64 which are independent of one another. Therefore, it is possible to control the amount of light emitted by the respective filament individually. As a result, lamp units with these heating apparatus enable the light intensity distribution on the article 6 to be treated to be set at will, and moreover, with high precision. Furthermore, instead of the respective arrangement of one individual feed device per filament of the heating apparatus of the first lamp unit 10 and the second lamp unit 20, depending on the desired light intensity distribution, several filaments can be connected to a single feed device. Several feed devices, as a whole, are also called the power source part 7 below.

In FIG. 1, above the first lamp unit 10, there is a reflector 2 which is composed, for example, by coating a base material of low-oxygen copper with gold. The reflection cross section has the shape of part of a circle, part of an ellipse, part of a parabola, a flat-board or the like. The reflector 2 reflects the light radiated up from the first lamp unit 10 and the second lamp unit 20 onto the side of the article 6 to be treated. This means that, in the heating device 100, the light emitted from the first lamp unit 10 and the second lamp unit 20 is irradiated directly or by reflection from the reflector 2 onto the article 6 to be treated.

In the lamp unit holding space S1, cooling air from the cooling air unit 8 is fed via cooling air supply nozzles 81 and blowout openings 82 into the chamber 300. The cooling air fed into the lamp unit holding space S1 is blown onto the respective heating apparatus 1 for the first lamp unit 10 and the second lamp unit 20 and cools the bulb 11 of the respective heating apparatus 1. The hermetically sealed portions 12a, 12b of the respective heating apparatus 1 have a lower heat resistance than other points. Therefore, it is desirable for some of the blowout openings 82 of the cooling air supply nozzles 81 to be opposite the hermetically sealed portions 12a, 12b of the respective heating apparatus 1 and to preferentially cool the hermetically sealed portions 12a, 12b of the respective heating apparatus 1. The cooling air which is blown onto the respective heating apparatus 1 and which has reached a high temperature by heat exchange is released from the cooling air release opening 83 of the chamber 300. The cooling air which was heated by heat exchange is guided such that it does not heat the heating apparatuses 1. The cooling air flow is routed such that the reflector 2 is simultaneously cooled. However, when the reflector 2 is water-cooled by a water cooling device (not shown), the air flow need not always be configured such that the reflector 2 is being cooled at the same time.

Heat is stored in the silica glass window 4 due to the radiant heat of the article 6 to be heated. There are cases in which, by secondary heat radiation which is emitted from the silica glass window 4 which has stored heat onto the article 6 to be treated, an unwanted heat action is applied. In this case, the disadvantages of redundancy of temperature controllability of the article to be treated (for example, overshoot in which the temperature of the article to be treated becomes higher that the setting temperature), a reduction of temperature uniformity in the article to be treated as a result of temperature variations of the silica glass window 4 itself in which heat is stored, and similar disadvantages occur. Furthermore, it becomes difficult to increase the rate of temperature reduction of the article 6 to be treated.

To eliminate this disadvantage, it is therefore desirable to arrange some of the blowout openings 82 for the cooling air feed also in the vicinity of the silica glass window 4 to cool the silica glass window 4 by the cooling air from the cooling air unit 8 as is shown in FIG. 1.

The respective heating apparatus 1 of the first lamp unit 10 is supported by a pair of first fixing frames 500, 501. The first fixing frames each are comprised of an electrically conductive frame 51 which is formed from an electrically conductive component and of a holding frame 52 which is formed from an insulating component made of ceramic or the like. The holding frame 52 is located on the inside wall of the chamber 300 and holds the electrically conductive frame 51 fast.

When the number of heating apparatus of the above described lamp unit 10 is n1 and the number of filaments formed by division in the above described heating apparatus is m1 and power is supplied to all filaments independently of one another, the combination number of the pair of first fixing frames 500 and 501 is n1×m1. The respective heating apparatus 1 of the second lamp unit 20 is supported by second fixing frames which, like the first fixing frames, are each formed of an electrically conductive frame and a holding frame. When the number of heating apparatus of the above described second lamp unit 20 is n2 and the number of filaments formed by division in the above described heating apparatus is m2 and power is supplied to all filaments independently of one another, the combination number of the pair of second fixing frames is n2×m2.

In the chamber 300, there is a pair of conductor ports 71, 72 for the power supply to which the feed lines of the feed devices of the power source part 7 are connected. FIG. 1 shows a pair of conductor ports 71, 72 for the power supply. The number of ports for the power supply is, however, fixed according to the number of heating apparatus 1, the number of filaments within the respective heating apparatus, and the like.

In the example as shown in FIG. 1, the port 71 for the power supply is electrically connected to the electrically conductive frame 51 of the first lamp fixing frame 501. Furthermore, the port 72 for the power supply is electrically connected to the electrically conductive frame 51 of the first lamp fixing frame 501.

The electrically conductive frame 51 of the first lamp fixing frame 500 is electrically connected, for example, to the outer lead 18*a* (FIG. 2) as the feed device of a heating apparatus 1 in the first lamp unit 10. The electrically conductive frame 51 of the first lamp fixing frame 501 is, for example, electrically connected to the outer lead 18*f* (FIG. 2). This arrangement enables to supply power to the filament 14*a* of one heating apparatus 1 in the first lamp unit 10 by the feed device. The other filaments 14*b*, 14*c* of the heating apparatus 1, the respective filament of the other heating apparatus 1 of the first lamp unit 10 and the respective filament of the respective heating apparatus 1 of the second lamp unit 20 are electrically connected by another pair of ports 71, 72 for the power supply in the same manner.

On the other hand, in the heat treatment space S2, there is a treatment frame 5 in which the article 6 to be treated is attached. If, for example, the article 6 to be treated is a semiconductor wafer, the treatment frame 5 is an annular body formed of a thin plate of metallic material with a high melting point, such as molybdenum, tungsten or tantalum, or of a ceramic material, such as silicon carbide (SiC) or the like, or of silica glass or silicon (Si). It is desirable that it has a guard ring arrangement in which a step part which supports the semiconductor wafer is formed in the inner peripheral area of its round opening.

The semiconductor wafer 6 is arranged such that it is installed in the circular opening of the above described annular support ring and is supported by the above described step part. The guard ring reaches a high temperature in itself by the light irradiation, and additionally heats the outer peripheral edge of the semiconductor wafer, which faces said guard ring, by radiation. Thus, the guard ring equalizes the thermal radiation from the outside peripheral edge of the semiconductor wafer. In this way, the temperature drop of the peripheral edge area of the semiconductor wafer as a result of heat radiation and the like from the outer peripheral edge of the semiconductor wafer is suppressed.

On the back of the light irradiation surface of the article 6 which is to be treated and which is located in the treatment frame 5, there is a temperature measurement part 91 bordering the article 6 to be treated or adjacent to it. The temperature measurement part 91 is used to monitor the temperature distribution of the article 6 to be treated. According to the dimensions of the article 6 to be treated, the number and the arrangement of the temperature measurement parts 91 are established. For example, a thermocouple or radiation thermometer is used for the temperature measurement part 91. The temperature information which has been monitored by the temperature measurement part 91 is sent to the thermometer 9 which, based on the temperature information sent from the respective temperature measurement part 91, computes the temperature at the measurement points of the respective temperature measurement part 91.

Furthermore, depending on the type of heat treatment, the heat treatment space S2 is connected to a process gas unit 800 which feeds or evacuates a process gas. In the case, for example, of carrying out a thermal oxidation process, the heat treatment space S2 is connected to the process gas unit 800 which feeds or evacuates oxygen gas and a purge gas (for example, nitrogen gas) for purging the heat treatment space S2. The process gas and the purge gas from the process gas unit 800 are delivered into the heat treatment space S2 from a blowout opening 85 of a gas supply nozzle 84 located in the chamber 300. Evacuation takes place through an outlet opening 86.

B. Heating Processes in the Invention

The heating process in accordance with the invention using the above described heating device of the light irradiation type is described below. In the heating process in accordance with the invention, the intensity distribution of the light emitted from a heat source onto the article to be treated is set according to the local distribution of a physical property of the article to be treated, such as a semiconductor wafer or the like, or according to the local distribution of the physical property of the raw material molecules in the space between the light emitting parts and the article to be treated, and thus heat treatment is performed.

To implement the heating process in accordance with the invention, as was shown for example above using FIG. 1, a heat treatment device of the light irradiation type is used which has lamp units with at least one light emitting part in which the intensity of the light emitted from the respective light emitting part can be controlled individually, and which is designed to be able to set the light intensity distribution on the article to be treated asymmetrically to its shape. If, for example, the article to be treated is a semiconductor wafer, on the surface of the semiconductor wafer according to the previous process step of heat treatment, a local distribution of a physical property is present which is often asymmetrical, as was described below.

In the heating process in accordance with the invention, with consideration of the local distribution of a physical property for the article to be treated before carrying out RTP, heating is performed when a desired physical property is imparted to the article to be treated by heating. There are the following processes as the heating processes with consideration of this local distribution of the physical property.

(1) Heating is performed such that the temperature distribution of the article to be treated becomes essentially constant. This means that heat treatment is performed such that according to the local distribution of a physical property on the surface of the article to be treated (the distribution of emissivity, distribution of the degree of light absorption or the like), the temperature distribution of the article to be treated during heat treatment becomes essentially constant.

(2) Heating is performed such that a physical property of the article to be treated has the desired distribution. This means that the distribution pattern of the light intensity is set for which the physical (electrical) property of the article to be treated acquires the desired distribution according to the local distribution of a physical property on the surface of an article to be treated, and thus heat treatment is performed.

Furthermore, the distribution pattern of the light intensity on the article to be treated, instead of being based on the local distribution of a physical property in the article to be treated, can also be set based on another parameter of heat treatment.

In the case, for example, of film formation on the semiconductor wafer surface, by heating of the semiconductor wafer by light irradiation, film formation is performed by raw gas, as a film material, being allowed to flow on the surface of the semiconductor wafer. In this connection, the distribution of the flow of raw gas on the surface of the semiconductor wafer is not always uniform. When, based on the conventional heating process, the semiconductor wafer is heated in this state, such that the temperature of the article to be treated is uniform and if film formation is performed in this way, a local distribution is formed in the composition of the film formed on the semiconductor wafer and in the film thickness. Therefore, there are also cases in which the local distribution of the physical property of the raw material molecules in the space between the above described light emitting parts and the article to be treated is not uniform. In this case, heating is performed in the manner described below.

(3) Heating is performed according to the local distribution of a physical property of the raw material molecules in the space between the above described light emitting parts and the article to be treated. This means that the local distribution of the property of the above described raw material molecules is measured, based on this measured value the distribution pattern of the light intensity on the article to be treated is determined which is necessary to impart the desired physical property to the light-heated article and heating is performed such that the article to be treated has a defined temperature distribution during heat treatment.

The above described points (1) to (3) are further described below.

(1) In the Case of Heating of the Article to be Treated Such that its Temperature Distribution Becomes Essentially Constant.

If, for example, the article to be treated is a semiconductor wafer, generally a film of metal oxide, metal nitride or the like is formed on the semiconductor wafer surface by sputtering or the like or impurities additive are doped by ion implantation.

In this connection, local distributions form on the wafer surface in the physical properties such as the surface conditions of the semiconductor wafer by film formation or the density of dopant ions which are implanted in the ion implantation process. These distributions are not always centrosymmetric to the center of the semiconductor wafer, but rather generally are asymmetrical to the center of the semiconductor wafer. If there is a distribution of surface conditions of the semiconductor wafer or a distribution of the density of implanted dopant ions, there is a distribution of emissivity on the semiconductor wafer surface. The amount of light absorption of the material which is irradiated with light depends on the emissivity of the material. The temperature of the semiconductor wafer therefore has a local distribution even if, for example, irradiation with light and heating are performed such that the surface of the semiconductor wafer has a uniform intensity distribution.

There are the following factors for the presence of the above described local distribution of emissivity.

(A) Distribution of the Surface Conditions of the Semiconductor Wafer

A typical factor in the formation of a local distribution of surface conditions of the semiconductor wafer consists in (i) different film types which are formed on the surface of the semiconductor wafer, and (ii) film formation conditions.

(i) Different Film Types which are Formed on the Surface of the Semiconductor Wafer.

In this connection, a case is imagined in which the semiconductor wafer is formed, for example, of monocrystalline silicon. According to the construction of the semiconductor devices, in one region of the semiconductor wafer surface, a $SiO_2$ film is formed, while in another region thereof, a SiN film is formed and in still another region, no film is formed. If, in this way, the types of films which have been formed differ locally, the emissivity differs in each film formation region.

(ii) Film Formation Conditions

Even for the same type of film, according to film formation conditions, regions with a dense film with a mirror-like surface form, while other regions yield a film with a porous surface. When these surface conditions of the film itself differ from one another, the emissivities each differ from one another.

A case is imagined in which, by the heat treatment described above in (A), on the surface of the semiconductor wafer with surface conditions which have a local distribution, for example, a SiN film, a poly-Si film or the like, with an essentially uniform film thickness is formed. It is assumed that the flow of raw gas which is fed into the heat treatment space S2 in heat treatment is hypothetically uniform on the surface of the semiconductor wafer. In this case, it is necessary to make the temperature of the semiconductor wafer which constitutes the article to be treated in heat treatment essentially uniform in order to form a SiN film, a poly-Si film or the like with an essentially uniform film thickness on the semiconductor wafer by heat treatment.

(B) Density of the Implanted Dopant Ions

When the density of the dopant ions which are being implanted in the ion implantation process differs, as in the above described case of different surface conditions of the semiconductor wafer, the emissivity also differs. This means that a local distribution of emissivity forms according to the local distribution of the density of dopant ions on the surface of the semiconductor wafer.

According to the above described (B), a case is imagined in that, on the surface of the semiconductor wafer with a local distribution of the density of implanted dopant ions, by heat treatment a SiN film, an oxide film or the like, with an essentially uniform film thickness is formed. It is assumed that the flow of raw gas which is fed into the heat treatment space S2 in heat treatment is hypothetically uniform on the surface of the semiconductor wafer. In this case, it is necessary to make essentially uniform the temperature of the semiconductor wafer which constitutes the article to be treated in heat treatment in order to form a SiN film, an oxide film or the like with an essentially uniform film thickness on the semiconductor wafer by heat treatment.

Figure 3A:
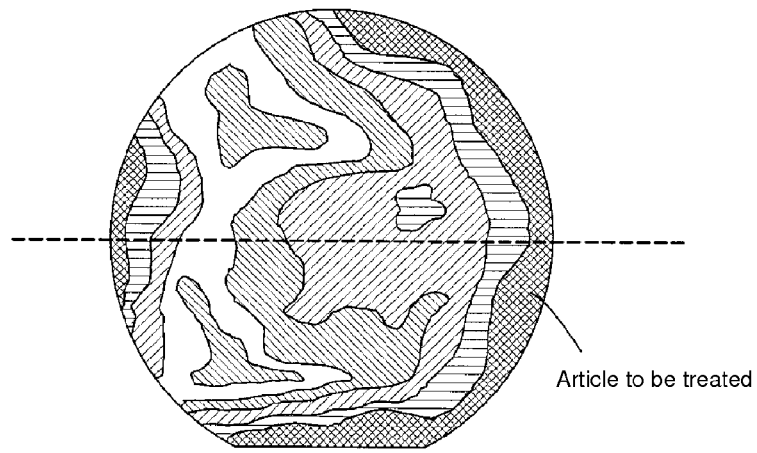
FIGS. 3(a) to 3(d) schematically illustrate a temperature model of the article to be treated for light irradiation of the article to be treated with a distribution of emissivity and for heating thereof such that the light irradiation has a uniform intensity distribution.
Figure 3B:
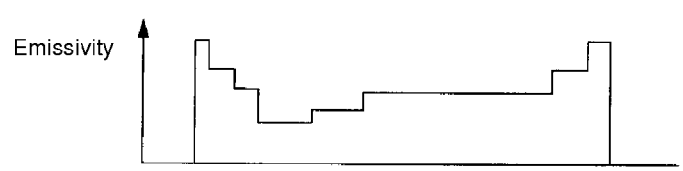
Figure 3C:
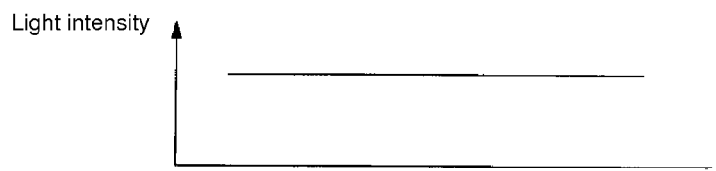
Figure 3D:
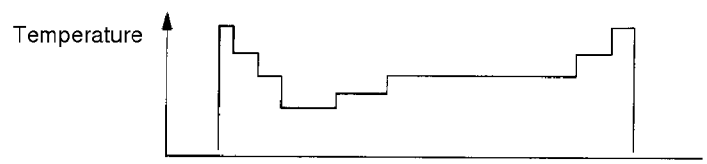

FIGS. 3(a) to 3(d) each show a model of the temperature of the article to be treated for heating of an article to be treated with a distribution of emissivity by light irradiation such that the surface of the article to be treated has a uniform intensity distribution. It is assumed that the article to be treated which is, for example, a semiconductor wafer has an emissivity distribution which is asymmetrical relative to the center of the semiconductor wafer, as shown in FIG. 3(a). FIG. 3(b) shows the emissivity on the broken line according to FIG. 3(a). If, in this connection, as shown in FIG. 3(c), heating is performed by light irradiation such that the surface of the article to be treated has a uniform intensity distribution, the temperature of the semiconductor wafer has a distribution corresponding to the distribution of emissivity according to FIG. 3(b), as is shown in FIG. 3(d). This means that the temperature of the semiconductor wafer dos not become uniform. The distribution of the light intensity shown in FIG. 3(c) and the temperature distribution shown in FIG. 3(d) each exhibit the distribution on the broken line according to FIG. 3(a).

Figure 4:
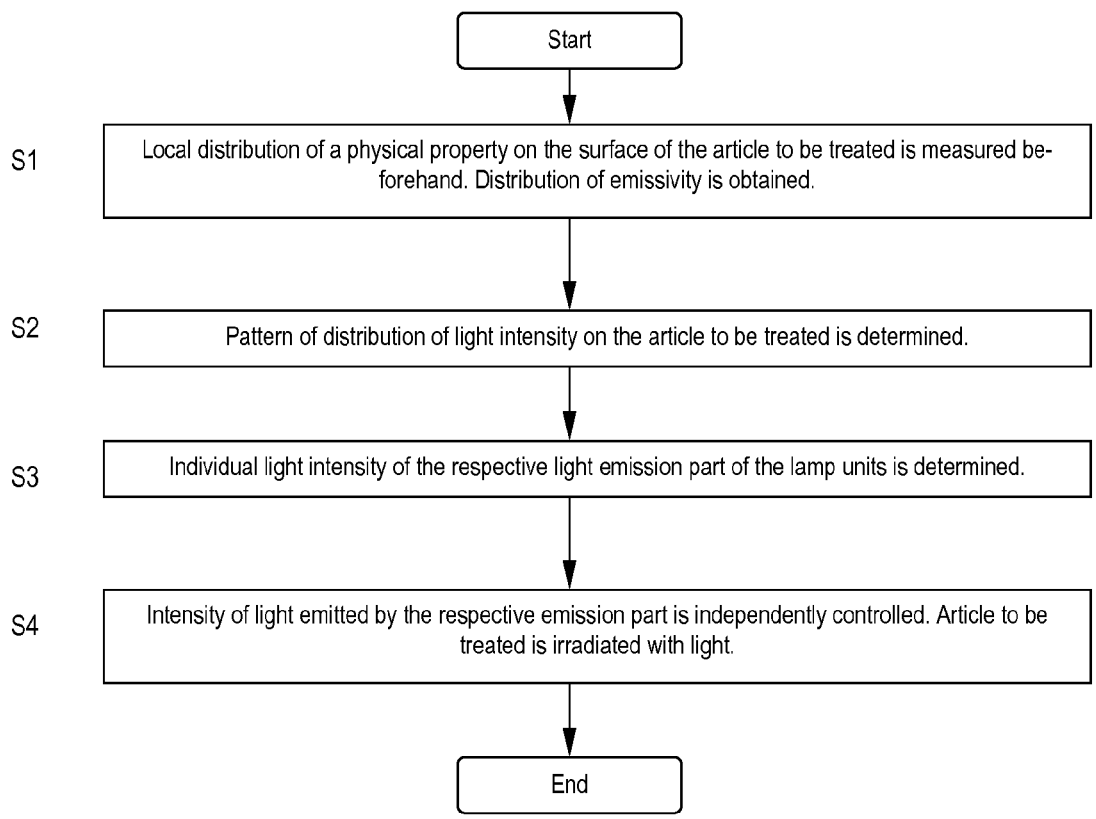
FIG. 4 is a flow chart of the heating process in accordance with the invention in the case of heating such that the temperature distribution of the article to be treated is made essentially uniform.

In the heating process in accordance with the invention, according to (1), heating of the light irradiation type is performed according to the sequence shown schematically in FIG. 4. First, the local distribution of a physical property on the surface of the article to be treated (for example, a semiconductor wafer) is measured beforehand, and thus, the distribution of the emissivity is obtained (step S1). Next, the distribution pattern of the light intensity on the article to be treated is calculated (step S2). This distribution of light intensity corresponds to the local distribution of emissivity of the article to be treated. Computation is performed such that the distribution of the amount of light absorption of the article which is to be treated and which has been irradiated with light is made essentially uniform and that as a result the temperature of the article to be treated during light irradiation is made essentially uniform.

Next, for the lamp units with at least one light emitting part of the heating device, the individual intensity of the light emitted from the respective light emitting part is determined. These individual light intensities are used to implement the above described distribution pattern of the light intensity on the article to be treated (step S3). Afterwards, the article to be treated is irradiated with light by the intensity of the light emitted by the respective light emitting part being controlled individually in the lamp units with at least one light emitting part of the heating device so that the individual intensities of the light emitted by the respective light emitting part reaches the value determined in step S3 (step S4). In step S4, the article to be treated is irradiated with light by the above described distribution pattern of the light intensity on the article to be treated being maintained. The distribution pattern of the light intensity determined in the above described step 2 can also be corrected with consideration of the degree of temperature decrease in the above described peripheral edge area by heat radiation and the like from the peripheral edge area of the semiconductor wafer.

Figure 5A:
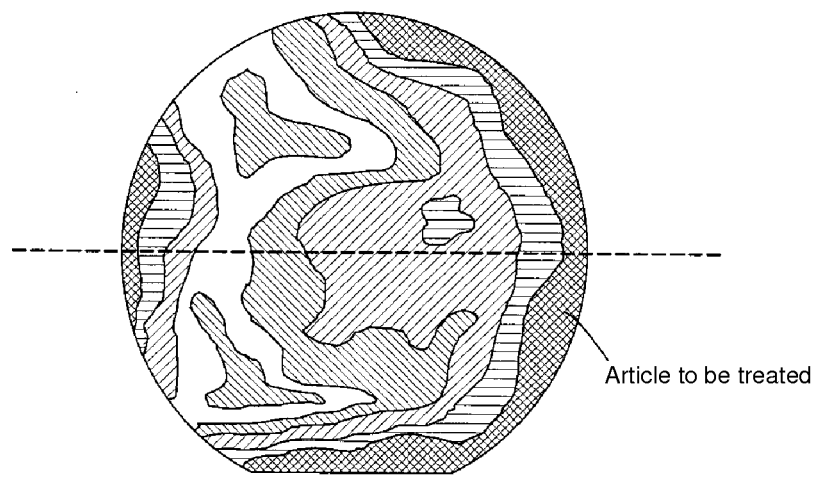
FIGS. 5(a) to (d) schematically illustrate a temperature model of the article to be treated when it is heated with a distribution of emissivity based on the heating process in accordance with the invention.
Figure 5B:
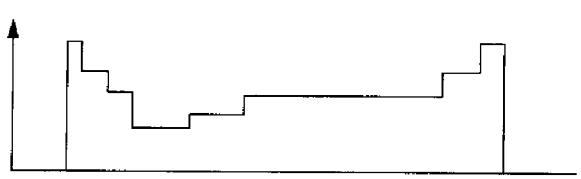
Figure 5C:
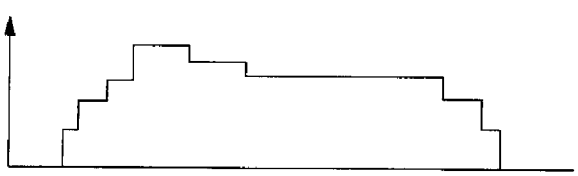
Figure 5D:
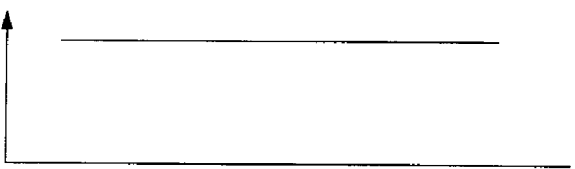

FIGS. 5(a) to 5(d) each show a model of the temperature of the article to be treated when the article to be treated is heated with an emissivity distribution based on the heating process in accordance with the invention. It is assumed that, as is shown in FIG. 5(a), the article to be treated which is, for example, a semiconductor has an emissivity distribution which is asymmetrical to the center of the semiconductor wafer. FIG. 5(b) shows the emissivity on the broken line according to FIG. 5(a). If, in this connection, as shown in FIG. 5(c), the light intensity distribution on the surface of the semiconductor wafer is set to a pattern corresponding to the distribution of the emissivity according to FIG. 5(b) and the semiconductor wafer is irradiated with light and heated, the semiconductor has an essentially uniform temperature distribution, as is shown in FIG. 5(d). The light intensity distribution shown in FIG. 5(c) and the temperature distribution shown in FIG. 5(d) each exhibit the distribution on the broken line according to FIG. 5(a).

In this connection, the distribution of the surface conditions is calculated as follows based on different types of films which are formed on the semiconductor surface.

For example, emissivity is measured in that radiant light which is emitted from a black body with a known temperature, or at least two rays with different wavelengths are emitted, and that the relation between the intensity of the reflected light and the wavelength is measured. For example, an emissivity measurement device which is sold by Japan Sensor Corp. can be used. By measuring by means of scanning of the measurement points within a wafer, the distribution of the emissivity is obtained. The distribution of the surface conditions which arise according to the film formation conditions can be measured in the same way as the above described manner. Furthermore, the distribution of the density of the dopant ions can be measured as follows.

For example, measurement is performed by Auger electron spectroscopy. When a scanning Auger electron spectroscopy analysis device is used, the distribution of the ion concentration within the wafer surface can be nondestructively measured. For simplification, a x-ray fluorescence analysis process can be used. In this case, the measurement points within the wafer are scanned and the distribution is measured.

In the heating process in accordance with the invention, the distribution of the surface conditions described above in (A) or the local distribution of a physical property of the article to be treated described above in (B), such as the distribution of the density of the implanted dopant ions, which conventionally have never been considered in the heating process, is measured beforehand, thus the distribution of emissivity is determined, and on this basis, the distribution pattern of the light intensity on the article to be treated is set at which the temperature of the article to be treated during light irradiation becomes essentially uniform, and the article to be treated is heated by light irradiation such that the set distribution pattern of the light intensity is maintained. Therefore, compared to a conventional heating process, it becomes possible to make uniform the temperature of the article to be treated during light irradiation with high precision. After heating, thus, the desired physical properties can be imparted to the article to be treated.

As was described above, there are many cases in which the local distribution of the physical property in the article to be treated is asymmetrical to its shape. However, in the heating process in accordance with the invention, a heat treatment device of the light irradiation type is used which has lamp units with at least one light emitting part in which the intensity of the light emitted from the respective light emitting part can be controlled individually, and which is designed to be able to set the light intensity distribution on the article to be treated asymmetrically to its shape. Therefore, it is also possible to handle the local distribution of the physical property which is asymmetrical to the shape of the article to be treated in a suitable manner.

In a conventional case of monitoring the temperature of the article to be treated during light irradiation with a radiation thermometer and in the case of controlling the intensity distribution of the light emitted from the lamp units on the article to be treated based on its their results, the following disadvantages occur.

As was described above, a conventional heating device of the light radiation type can set the distribution pattern of the light intensity on the article to be treated only symmetrically to its shape. Furthermore, there are many cases in which the article to be treated is turned during light irradiation. Therefore, it is difficult to make the temperature of the article to be treated uniform with high precision during light irradiation, when an article to be heat treated has a local distribution of a physical property which is often asymmetrical to the shape of the article to be treated.

Furthermore, since a radiation thermometer is used, in the case of heating of the article to be treated with a local distribution of emissivity, the effect of the temperature measurement error due to a nonuniform emissivity distribution cannot be ignored. The temperature measurement error in heat treatment causes a temperature distribution of the article to be treated. There is a possibility of slip occurring in the semiconductor wafer, and thus, the inferior goods being formed under certain circumstances.

Conversely, based on the distribution of emissivity, the distribution pattern of the light intensity on the article to be treated is set by the heating process in accordance with the invention, for which the temperature of the article to be treated during light irradiation is made essentially uniform, and thus light irradiation is performed. Therefore, it becomes possible to avoid the above described disadvantages as a result of measurement error of the radiation thermometer.

(2) Case of Heating Such that the Physical Property of the Article to be Treated has the Desired Distribution.

As was described above, in the density of the dopant ions on the surface of the semiconductor wafer, a local distribution arises when the article to be treated is a semiconductor wafer which is doped by ion implantation with impurities additive. This distribution is not always centrosymmetric relative to the center of the semiconductor wafer, but rather generally is asymmetrical to the center of the semiconductor wafer.

These dopant ions with which the semiconductor wafer is doped are activated by heat treatment. In this connection, by way of example, a case can be imagined in which the density of the doped foreign ions has a local distribution, a film is not formed on the surface of this wafer by heat treatment, but the dopant ions are activated by heat treatment. First of all, it is imagined that, based on the conventional heating process, heating is performed such that the temperature of the article to be treated becomes uniform, and thus, activation is carried out. In this case, a distribution of the carrier concentration arises on the surface of the semiconductor wafer according to the distribution of density of dopant ions. This means that the locations with a high density of dopant ions have a higher carrier density and a lower sheet resistance value. On the other hand, the locations with low density of dopant ions have a lower carrier density and a higher sheet resistance value. The local electrical property of the semiconductor wafer therefore varies, which makes it difficult to obtain a uniform electrical property.

Figure 6:
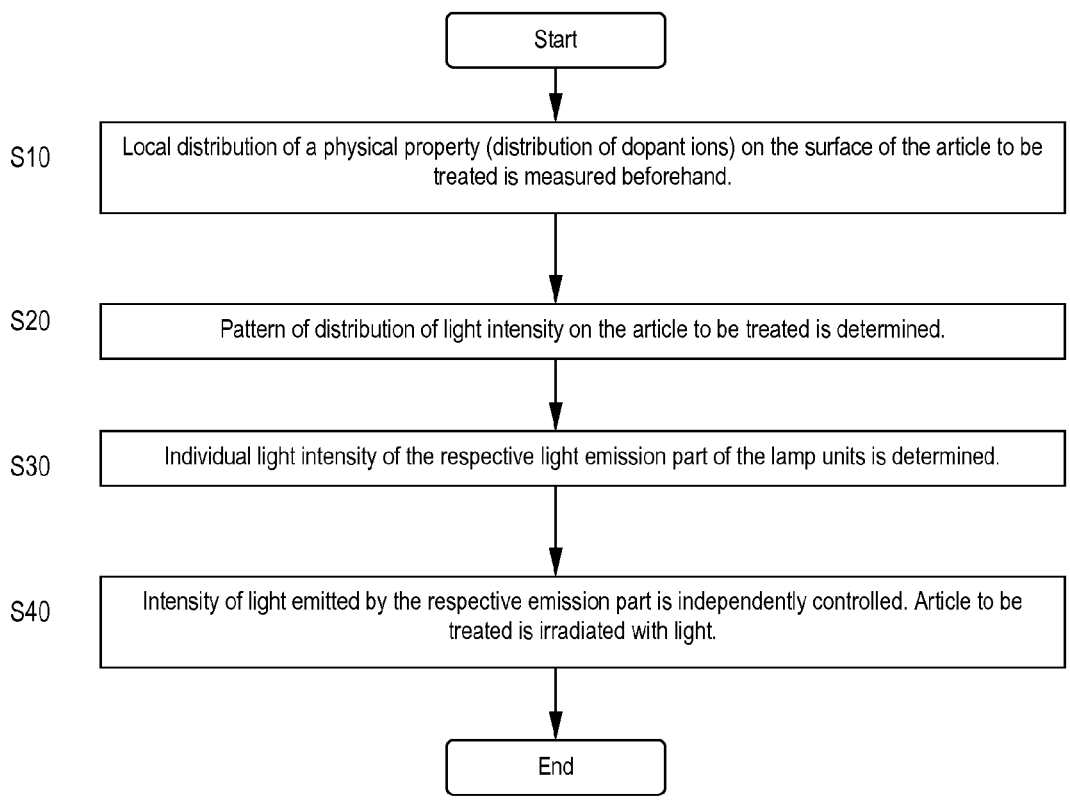
FIG. 6 is a flow chart of the heating process in accordance with the invention in the case of heating such that the desired distribution of the physical property of the article to be treated is obtained.

In the heating process in accordance with the invention according to (2), this article to be treated is heated with the sequence shown schematically in FIG. 6 by light irradiation.

First, the local distribution of a physical property (for example, the distribution of dopant ions) on the surface of the article to be treated (for example, a semiconductor wafer) is measured beforehand (step S10). Next, the distribution pattern of the light intensity on the article to be treated is measured (step S20). This pattern of the distribution of light intensity corresponds to the local distribution of the density of dopant ions of the article to be treated. Specifically, the temperature distribution of the article to be treated during light irradiation is determined according to the local distribution of the density of dopant ions of the article to be treated so that the carrier concentration of the heat-treated article becomes essentially uniform, and thus, an essentially uniform electrical property is imparted to the article to be treated. The distribution of the light intensity on the article to be treated in which this temperature distribution is actualized is determined.

Next, for lamp units with at least one light emitting part of the heating device, the individual intensity of the light emitted from the respective light emitting part is determined. These individual light intensities are used to implement the above described distribution pattern of the light intensity on the article to be treated (step S30). Afterwards, the article to be treated is irradiated with light by the intensity of the light emitted by the respective light emitting part being controlled individually in the lamp units with at least one light emitting part of the heating device, so that the individual intensity of the light emitted by the respective light emitting part reaches the value determined in step S30 (step S40). This means that, in step S40, the article to be treated is irradiated with light by the above described distribution pattern of the light intensity on the article to be treated being maintained. The distribution pattern of the light intensity determined in the above described step 20 can also be corrected with consideration of the degree of temperature decrease in the above described peripheral edge area by heat radiation and the like from the peripheral edge area of the semiconductor wafer. The distribution of the density of the dopant ions is measured in the sequence described below.

In the heating process in accordance with the invention, the local distribution of a physical property of the article to be treated, such as the distribution of the density of the implanted dopant ions, is measured beforehand, based on this measurement result, the distribution pattern of the light intensity on the article to be treated is set such that essentially uniform electrical properties are imparted to the heated article, and the article to be treated is irradiated with light and heat-treated such that the set distribution pattern of the light intensity is maintained.

In the conventional heating process, there is the idea of making the temperature of the article to be treated uniform during heat treatment. However, it was not considered that measuring the local distribution of the physical properties of the article to be treated beforehand and based on this measurement result, the distribution pattern of the light intensity on the article to be treated is set such that the temperature of the article to be treated during the heat treatment is set not to be uniform but dare to be arise the temperature distribution.

In the heating process in accordance with the invention, as was described above, the distribution pattern of the light intensity on the article to be treated is set such that essentially uniform electrical properties are imparted to the article to be treated after heat treatment. This means that, in the heating process in accordance with the invention, it has become possible to impart essentially uniform electrical properties to the heat-treated article. The electrical properties which are imparted to the heat-treated article are not limited to an essentially uniform electrical property, but if necessary the desired distribution of electrical properties can be imparted as required.

The physical properties which are imparted to the heat-treated article are not limited to electrical properties, but can be desired physical properties as required. In this case, the local distribution of the physical property to be measured beforehand on the surface of the article to be treated need not be the distribution of dopant ions. That is, any local distribution of a physical property can measured which has to do with imparting the desired distribution of a physical property after heat treatment.

In the second heating process of the invention, a heat treatment device of the light irradiation type is also used which has lamp units with at least one light emitting part in which the intensity of the light emitted from the respective light emitting part can be controlled individually, and which is designed to be able to set the light intensity distribution on the article to be treated asymmetrically to its shape. Therefore, it is possible to handle the local distribution of the physical property which is often asymmetrical to the shape of the article to be treated in a suitable manner.

In this connection, if the semiconductor wafer is, for example, a compound semiconductor wafer of gallium arsenide, the above described heat treatment is often performed at a temperature of at most 1000° C. In this case, slip does not occur, even if a nonuniform temperature distribution occurs in the semiconductor wafer. This means that the disadvantage of slip does not occur even if the temperature of the article to be treated during heat treatment is not set to be uniform, but is intentionally set such that a temperature distribution is formed, as was described above.

(3) Case of Heating According to the Local Distribution of the Physical Properties of the Raw Material Molecules in the Space Between the Above Described Light Emitting Parts and the Article to be Treated In the above described heating process according to (1) and (2), the distribution pattern of the light intensity on the article to be treated is set such that the article to be treated during heat treatment has an essentially uniform temperature distribution or a given temperature distribution. But here, the local distribution of the properties of the raw material molecules is measured and, based on this measured value, the distribution pattern of the light intensity is determined. In the case, for example, of film formation on the surface of the semiconductor wafer by heating, film formation is performed by heating the semiconductor wafer by light irradiation by the raw gas as the film material being allowed to flow on the surface of the semiconductor wafer.

In this connection, the distribution of the flow of raw gas on the surface of the semiconductor wafer is influenced by various factors, such as the shape of the heat treatment space, the position at which the raw gas is supplied with a given flow rate into this heat treatment space, and the shape of the blowout opening of the gas nozzle for delivering the raw gas, and is not uniform. If, in this state, the semiconductor is heated using the conventional heating process and film formation is performed such that the temperature of the article to be treated becomes uniform, a local distribution arises in the composition of the film formed on the semiconductor wafer and its film thickness. As a result, variations of the electrical property of the semiconductor wafer, and consequently, variations in the device characteristic arise.

The above described disadvantages are difficult to eliminate by conventional heat treatment designed to make the temperature of the article to be treated uniform.

In the heating process in accordance with the invention, according to (3), in this article to be treated, the local distribution of the physical properties of the raw material molecules, such as the gas distribution of the reactant gas for film formation in the space between the light emitting parts and the article to be treated and the like, is estimated, for example, by measuring the film thickness distribution of the film formed on the surface of a dummy article, and based on the measured film thickness distribution and the film formation rate determining the individual intensity of the light emitted from the light emitting parts.

The above described gas distribution of the reactant gas for film formation is a local distribution of the physical properties of the raw gas molecules which influences the film formation reaction rate. Specifically, it is a local distribution of the physical property in which the concentration distribution of the reactant gas molecules for film formation, the distribution of the gas flow velocity, the concentration distribution of the secondary product (by-product) produced by the film formation reaction, the adsorption/desorption distribution of the reactant gas for film formation with respect to the article to be treated (i.e., the distribution of the number of molecules of the reactant gas for film formation per unit of time) and the like, are reflected in a complex manner and corresponds to the above described film thickness distribution.

Figure 7:
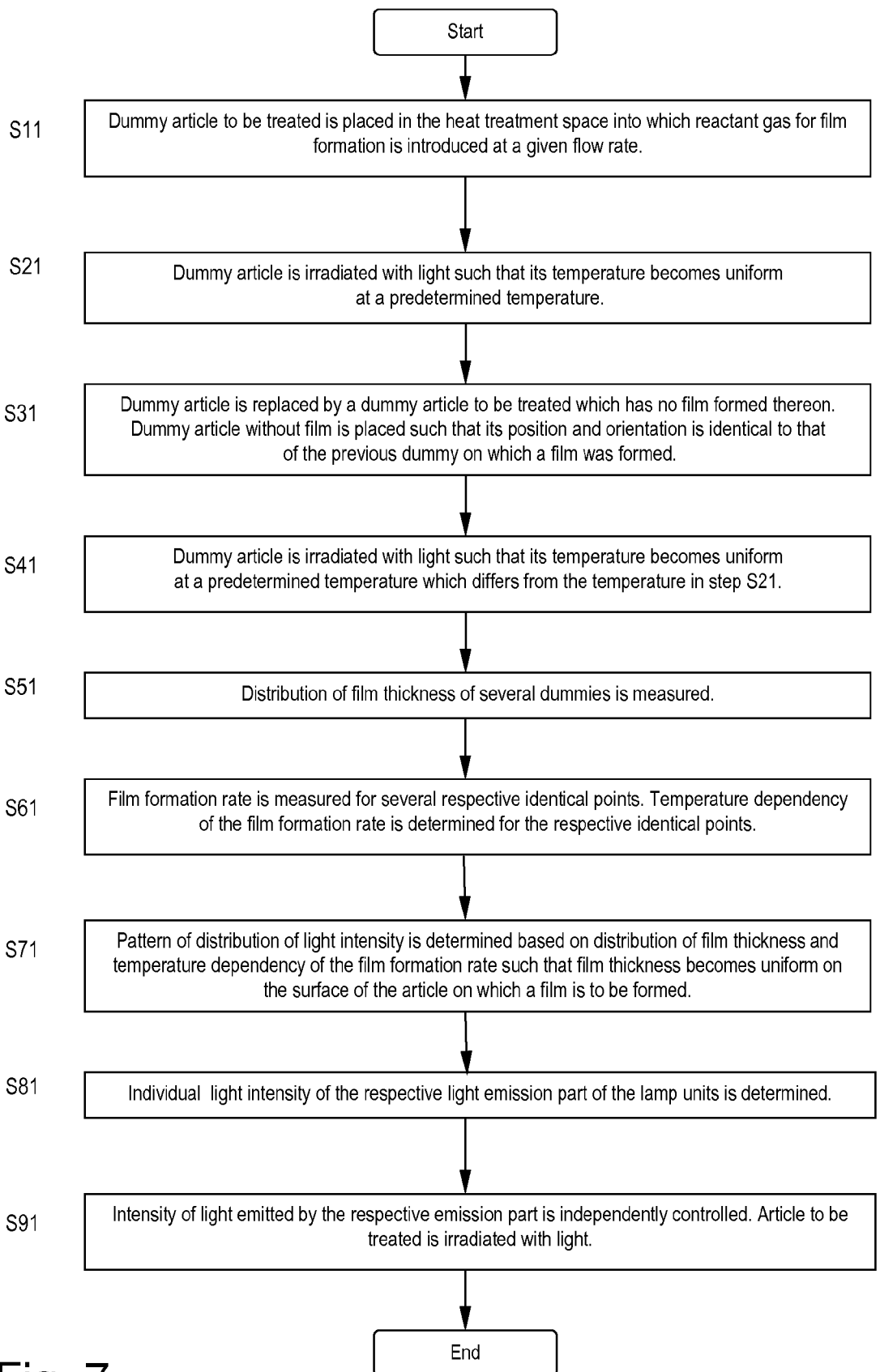
FIG. 7 is a flow chart of the heating process in accordance with the invention in the case of heating according to the local distribution of the physical property of the raw material molecule in the space between the light emitting parts and the article to be treated.

Specifically, heating of the light irradiation type is performed, for example, in the sequence shown schematically in FIG. 7. First, an article to be treated as a dummy (for example, a semiconductor wafer) is placed in the heat treatment space in which reactant gas for film formation is supplied with a given flow rate (step S11). Next, the dummy article is irradiated with light such that the temperature of the dummy article at a given temperature becomes uniform (step S21). If, in this connection, the dummy article is doped, for example, by ion implantation with impurities additive, the above described sequence of steps S1 to S4 according to FIG. 4 corresponds to step 21.

In the case of a semiconductor wafer, in which the dummy article has not been subjected to pretreatment, such as ion implantation, film formation, or the like, irradiation is performed with light with a given light intensity so that the distribution of the light intensity becomes essentially constant outside of the peripheral edge area of the surface of the semiconductor wafer. Thus the objective is for the temperature of the surface of the semiconductor wafer which constitutes the dummy article during light irradiation to become essentially uniform at a given temperature. The temperature of the peripheral edge area of the semiconductor wafer drops as a result of heat radiation from the above described peripheral area compared to the temperature outside of the peripheral edge area. The intensity of the light radiated onto the peripheral edge area of the semiconductor wafer is therefore set such that it is greater than the light intensity outside of the peripheral edge area of the surface of the semiconductor wafer, with a distribution which is set to be essentially constant.

In the case of a semiconductor wafer in which the dummy article has not been subjected to pretreatment such as ion implantation, film formation, or the like, specifically with consideration of the temperature decrease of the peripheral edge area of the semiconductor wafer, the distribution pattern of the light intensity on the surface of the semiconductor wafer is set. For lamp units with at least one light emitting part of the heating device, the individual intensity of the light emitted from the respective light emitting part is set and controlled such that this distribution pattern of light intensity is implemented, and thus, the semiconductor is irradiated with light. In this way, the temperature of the surface of the semiconductor wafer which constitutes the dummy article during light irradiation becomes essentially uniform at a given temperature.

Next, the dummy article which was irradiated with light in step S21 and in which a film has been formed is replaced by a dummy article in which a film is not formed (step S31). The position and location of the dummy article after replacement in which a film is not formed, are selected such that they are identical to the position and location of the dummy article during light irradiation in which a film was formed beforehand. If the dummy article is a semiconductor wafer, the direction of the orientation flat or a notch as a reference shape of the semiconductor wafer without film formation is positioned in the same direction as the direction of the orientation flat or notch during light irradiation of the semiconductor wafer in which a film has been formed beforehand. Next, this dummy article in which a film has not been formed is irradiated with light such that the temperature of the dummy article becomes uniform (step S41) at a temperature which differs from that in step S21. The film thickness distribution of several (two) dummy articles in which films were formed in step S21 and in step S41 is measured (step S51). Furthermore, the film formation rate is measured at any identical locations of the above described two dummy articles and the temperature dependency of the film formation rate is determined at any identical locations of the dummy articles which are located in the reactant gas for film formation (step S61). In this connection the film formation rate is determined by the film thickness being divided by the film formation time.

Based on the film thickness distribution and the temperature dependency of the film formation rate which were determined in step S51 and in step S61, the distribution pattern of the light intensity is determined on the article to be treated which is used to make uniform the film thickness distribution of the film formed on the surface of the article to be treated (step S71).

This distribution pattern of light intensity consequently becomes a pattern which corresponds to the nonuniform gas flow distribution of the raw gas on the surface of the semiconductor wafer.

In step S61, "any identical location of the dummy articles to be treated" is defined exactly as follows, for example. First, any location of the light emitting part of the lamp unit which has at least one light emitting part is taken as the reference point. Proceeding from this reference point, a vertical line (virtual line) is drawn to the surface of the dummy articles to be treated. The point of intersection of this vertical line with the surface of the dummy articles to be treated is defined as "any identical location of the dummy articles to be treated".

In the above described example, the location and position of the two dummy articles to be treated are made essentially identical and the same locations based on the reference shape of the dummy articles to be treated are defined as "any identical locations of the dummy articles to be treated". When the positioning accuracy of the positions and locations of the two articles to be treated is high enough, it is not regarded as disadvantageous if the same locations are defined as "identical locations of the dummy articles to be treated" based on the reference shape of the dummy articles to be treated.

Next, in the lamp units with at least one light emitting part of the heating device, the individual intensity of the light emitted from the light emitting parts is determined. These individual light intensities are used to implement the above described distribution pattern of the light intensity on the article to be treated (step S81). Afterwards, the article to be treated is irradiated with light by the intensity of the light emitted by the respective light emitting part being controlled individually in the lamp units with at least one light emitting part of the heating device so that the individual intensity of the light emitted by the respective light emitting part reaches the value determined in step S81 (step S91). In step S91, the article to be treated is irradiated with light by the above described distribution pattern of the light intensity on the article to be treated being maintained. In the above described example, two dummy articles to be treated are heated under uniform temperature conditions at different temperatures and thus film formation is performed to determine the data of the film formation distribution and the temperature dependency of the film formation rate. However, at least three of the dummy articles to be treated can also be heated under uniform temperature conditions at different temperatures, film formation can be performed and the data of the film formation distribution and the temperature dependency of the film formation rate can be determined.

In the heating process in accordance with the invention, in a given raw gas feed atmosphere, several dummy articles to be treated are each heated under uniform temperature conditions at different temperatures, film formation is performed, the data of the film formation distribution and the temperature dependency of the film formation rate are determined, based on these data, the distribution pattern of the light intensity on the article to be treated is set such that, in the heated article, a film with an essentially uniform film thickness and composition is formed, and the article to be treated is subjected to heat treatment of the light irradiation type, such that the set distribution pattern of the light intensity is maintained.

In the conventional heating process, there is the idea of making the temperature of the article to be treated uniform during heat treatment. If, in the case of a nonuniform gas flow distribution of the raw gas on the surface of the semiconductor wafer which constitutes the article to be treated, the semiconductor wafer is heated based on the conventional heating process and this film formation is performed such that the temperature of the article to be treated becomes uniform, a local distribution is formed in the composition and the film thickness of the film formed on the semiconductor wafer. As a result, variations of the electrical properties of the semiconductor wafer and as a result, variations in the device characteristic arises.

In the heating process in accordance with the invention, the distribution pattern of the light intensity on the article to be treated is set such that a film with an essentially uniform film thickness and composition is formed in the heated article, as was described above. In the heating process in accordance with the invention, it therefore became possible to suppress the disadvantage of variations of the electrical properties of the semiconductor wafer as the heat-treated article and the resulting disadvantage of variations in the device characteristic.

C. Detailed Sequence of the Heating Process in Accordance with the Invention

The detailed sequence of the heating process in accordance with the invention is described below.

Figure 8:
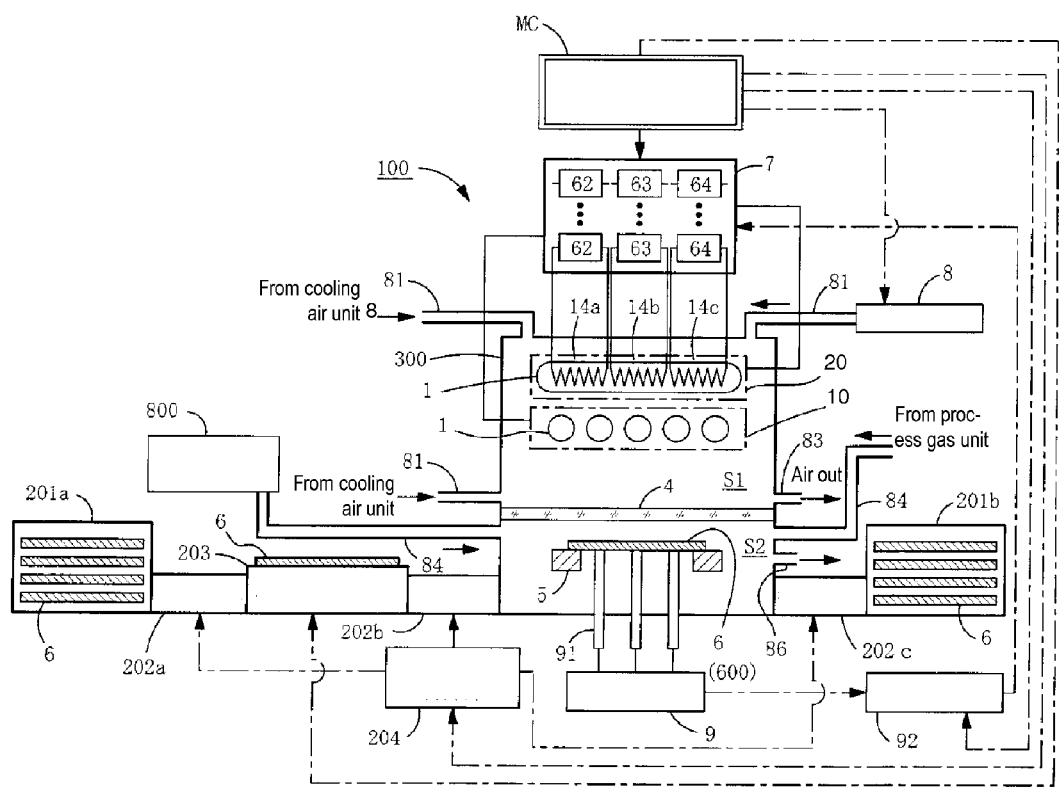
FIG. 8 is a controller diagram including a heating apparatus of the light irradiation type for performing a heat treatment sequence in accordance with the invention.

FIG. 8 is a controller diagram including the heating device of the light irradiation type for executing the heat treatment sequence in accordance with the invention. Since the heating device 100 was explained in detail with reference to FIG. 1, it is shown here in only a simplified form. FIG. 8 also partially shows a part omitted in FIG. 1. As was described above, the heating device 100 has a chamber 300 with an inside divided by a silica glass window 4 into a lamp unit holding space S1 and a heat treatment space S2. The first lamp unit 10 and the second lamp unit 20 which are located in the lamp unit holding space emit light which is radiated via the silica glass window 4 onto the article 6 which is to be treated, which is located in the heat treatment space 2 and which is thus heat-treated.

The lamp units 10 and 20 are each supplied power by feed devices 62, 63, 64, which are located in the power source part 7. FIG. 8 shows that the feed lines which connect the two ends of the filaments 14a, 14b, 14c, of the heating apparatus 1 to the feed devices 62, 63, 64, are routed out from other than the two ends of the heating apparatus 1. However, the connection state of the filaments to the feed devices is only schematically shown here. In practice, all of the above described feed lines are routed out from the two ends of the heating apparatus, as was described above with reference to FIG. 2.

In the lamp unit holding space S1, as was described above, cooling air from the cooling unit 8 is delivered from the cooling air supply nozzle 81 into the chamber 300.

In the heat treatment space S2, there is a treatment frame 5 in which the article 6 to be treated is attached. On the back of the light irradiation surface of the article 6 which is to be treated and which is located in the treatment frame 5, there is a temperature measurement part 91 bordering the article 6 to be treated or adjacent to it. The temperature measurement part 91 is used to monitor the temperature distribution of the article 6 to be treated. According to the dimensions of the article 6 to be treated, the number and the arrangement of the temperature measurement parts 91 are established. The temperature data which have been monitored by the temperature measurement parts 91 are sent to the thermometer 9 which, based on the temperature data sent from the respective temperature measurement part 91, computes the temperature at the measurement point of the respective temperature measurement part 91. The temperature computed by the thermometer 9 is sent to a temperature controller 92. These temperatures, which are described in the "second embodiment of the heat treatment process," are used in the case of control with feedback. As is described above, a process gas unit 800 which feeds or evacuates a process gas is connected to the heat treatment space S2 as needed.

The process gas from the process gas unit 800 is fed into the heat space S2 from a gas supply nozzle 84. Evacuation takes place through an outlet opening 86.

On the preliminary stage of the heating device 100, there are a cassette 201a in which the article 6 to be treated is located and which has passed through a preceding process step, a transport unit 202a for transport of the article 6 to be treated to a positioning carrier 203, and a transport unit 202b which places the article 6 which is to be treated and in which the direction of the reference shape has been defined by the positioning carrier 203 in a given direction, on the treatment frame 5 in the heat treatment space. On the rear stage of the heating device 100 is a transport unit 202c for transport of the completely heated article 6 to a cassette 201b. Operation of these transport units 202a to 202c is controlled by the transport unit controller 204. The feed devices 62, 63, and 64 located in the power source part 7 are controlled by the main controller MC. Moreover, the main controller MC controls transport and heat treatment of the article 6 to be treated by controlling the above described cooling air unit 8, the transport unit controller 204, the positioning carrier 203 and the temperature controller 92.

(a) First Embodiment of the Heat Treatment Process

Figure 9:
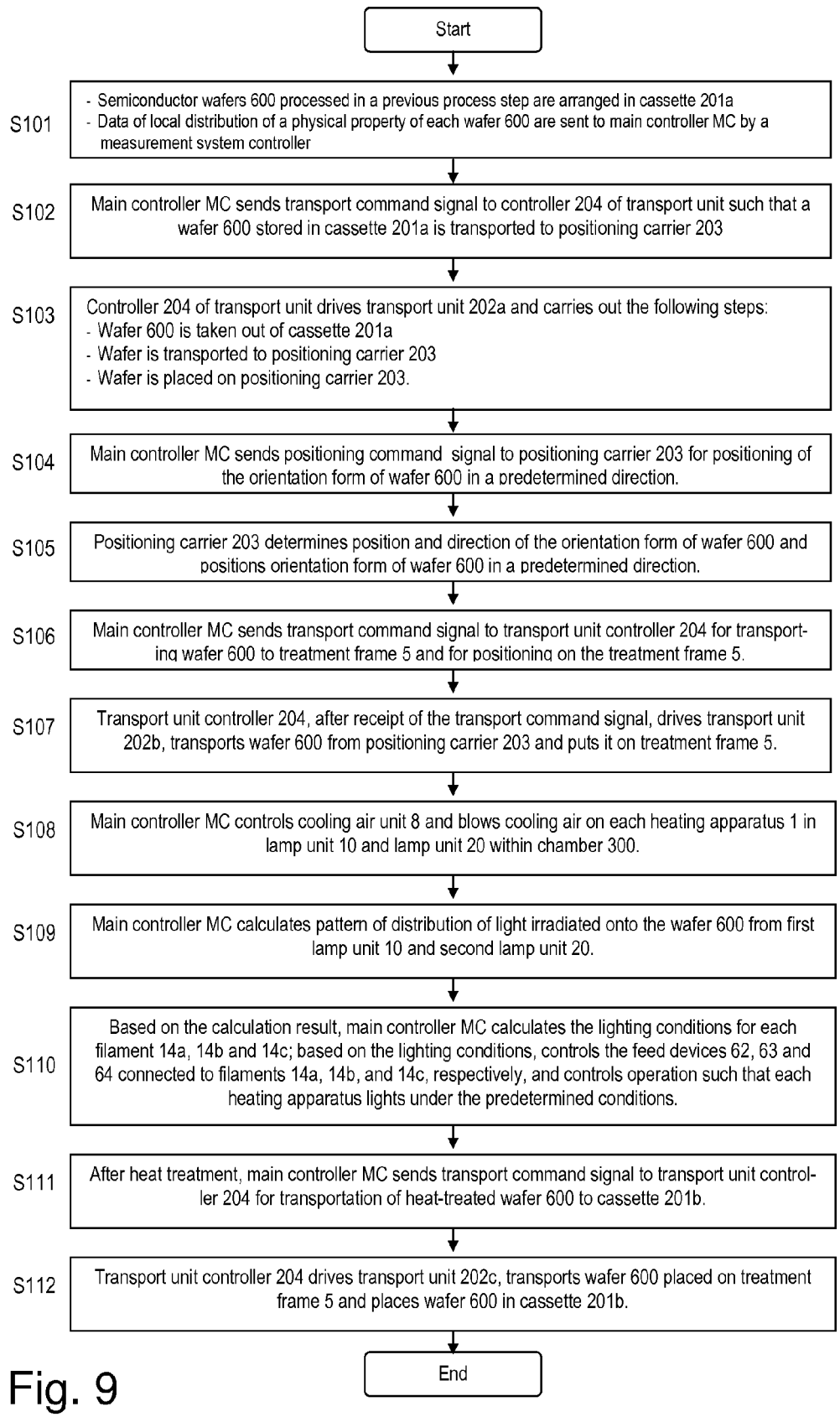
FIG. 9 is a flow chart of a first embodiment of the heat treatment process.
Figure 10:
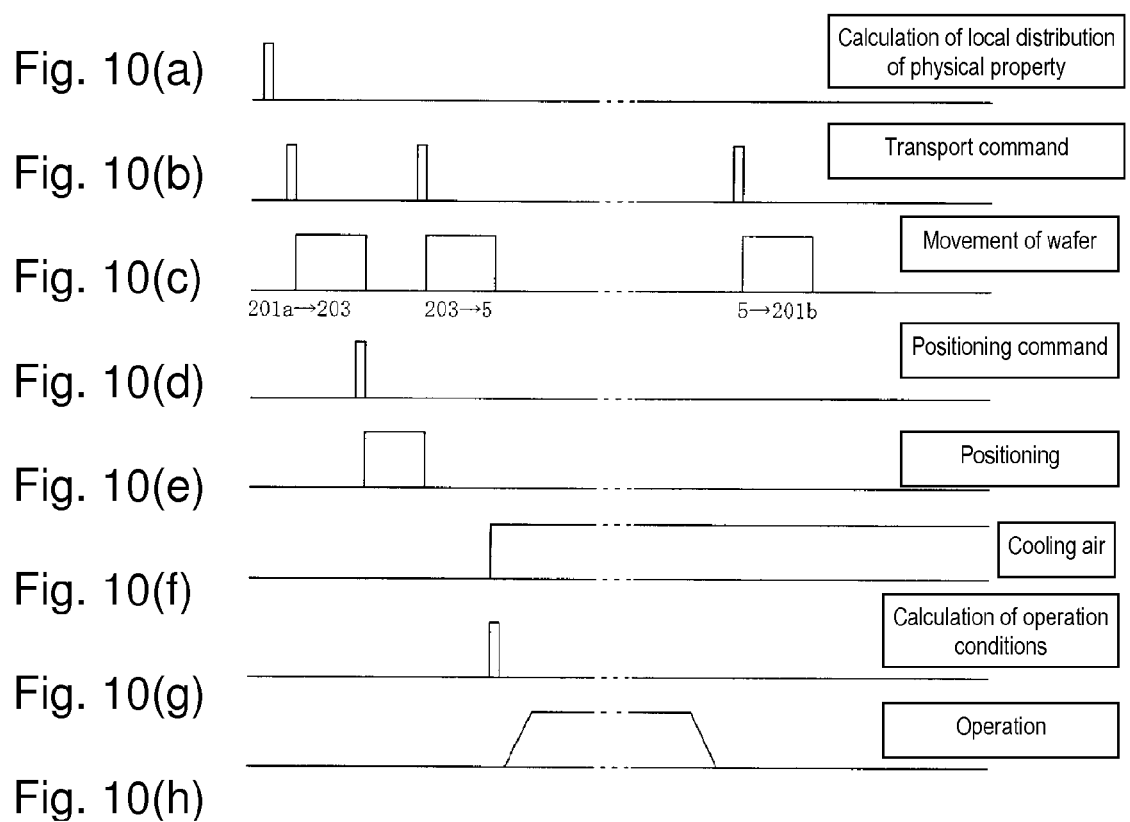
FIGS. 10(a) to 10(h) are time charts of the first embodiment of the heat treatment process.

Using an example in which the article 6 to be treated is a semiconductor wafer 600, a first embodiment of the heat treatment process in accordance with the invention is described using the controller diagram as shown in FIG. 8, the flow chart according to FIG. 9 and a time chart according to FIG. 10. The arrangement shown by way of example in FIG. 2 is made for the arrangement of the respective heating apparatus 1 of the lamp units 10, 20.

In FIG. 8, the semiconductor wafers 600 as the articles 6 which are to be treated and which have passed through a previous process step are transported by a transport device (not shown) to the heating device 100 and are located on the cassette 201a (step S101 in FIG. 9).

In this connection, the data of the local distribution of a physical property of the transported semiconductor wafer 600 are collected by a means for measuring a physical property which is not shown in the drawings. These data of the local distribution of the physical property are related to the position of the orientation flat or the notch as a reference shape of the semiconductor wafer. The data of the individual local distribution of the physical property of the respective semiconductor wafer 600 located on the cassette 201a are sent by a measurement system controller (not shown) of the means for measuring the distribution of the physical property to the main controller MC (FIG. 10a).

There are cases in which these data of the local distribution of the physical property are collected depending on the type of previous process step for the individual semiconductor wafer, while there are also cases in which the data are collected per lot of semiconductor wafers. Pretreatment in which the data of the local distribution of the physical property must be collected for each individual semiconductor wafer is, for example, ion implantation treatment as the process step before heat treatment; it is batch processing. Since the ions are implanted by the flat arrangement of the semiconductor wafer in a large susceptor and by rotation of these semiconductor wafers, variations occurs for each semiconductor wafer. For the individual semiconductor wafers, therefore, the local distribution of the physical property differs from one another.

When the semiconductor wafers, as pretreatment, have undergone epitaxial treatment or plasma-CVD treatment, for each semiconductor wafer variations also arises since these treatments are performed mainly wafer by wafer. Therefore, it is desirable even in semiconductor wafers which have undergone these pretreatments to collect the data of the local distribution of the physical property for the individual semiconductor wafer.

On the other hand, pretreatments after which the data of the local distribution of the physical property of the semiconductor wafers can be easily collected per lot are, for example, thermal CVD in batch processing and an oxide film formation process. In thermal CVD in batch processing and an oxidation process, normally 100 to 200 semiconductor wafers are processed as a batch. This means that for 25 FOUP (Front Opening Unified Pod) four to eight cassettes (25 semiconductor wafers per cassette) are placed in a single reaction tube and processed. In this case, the temperature distribution between the end of the reaction tube and the middle of the reaction tube differs. However, it hardly changes at a scope of 25 wafers per cassette. Therefore, it is sufficient if the data of the local distribution of the physical property are collected per lot unit. This means that it is sufficient if the data of the local distribution of the physical property for any semiconductor wafer are collected per lot of semiconductors.

In this connection, the local distribution of the physical property in the above described case that the preliminary process step is ion implantation is the local distribution of the dopant ion density on the surface of the semiconductor. The data of the local distribution of the physical property relate to the local distribution of the emissivity which has been determined based on the local distribution of the dopant ion density. This distribution of emissivity is used to compute the distribution pattern of the light intensity for implementing an essentially uniform distribution of the amount of light absorption of the article which is to be treated and which has been irradiated with light and as a result to implement an essentially uniform temperature of the article to be treated during light irradiation (see steps S1, S2 according to FIG. 4). This means that the data of the local distribution of the physical property in this connection are used for the above described "(1) Heating such that the temperature distribution of the article to be treated becomes essentially constant".

On the other hand, the data of the local distribution of the physical property for the case in which the previous process step is ion implantation are also used for heating such that the physical property of the article to be treated has a given distribution. This means that they are also used for determining the temperature distribution of the article to be treated during light irradiation according to the local distribution of the dopant ion density of the article to be treated such that the carrier concentration of the heat-treated article becomes essentially uniform and thus an essentially uniform electrical property is imparted to the article to be treated, and for computing the distribution pattern of the light intensity on the article to be treated in which this temperature distribution is implemented (see, steps S10 and S20, according to FIG. 6). This means that the data of the local distribution of the physical property in this connection are used for the above described "(2) Heating such that the article to be treated has the desired distribution of the physical property".

The local distribution of the physical property in which the previous process step is epitaxial treatment or plasma CVD is the distribution of the surface conditions of the semiconductor wafer, specifically the distribution of the emissivity. It is used to compute the distribution pattern of the light intensity for implementing an essentially uniform distribution of the amount of light absorption of the article which is to be treated and which has been irradiated with light, and as a result to implement an essentially uniform temperature of the article to be treated during light irradiation in order to heat it such that the temperature distribution of the article to be treated during the heat treatment described above in (1) becomes essentially constant (see steps S1, S2, according to FIG. 4).

The local distribution of the physical property of the semiconductor wafers which have undergone thermal CVD as batch processing or oxide film formation as the preceding process step is the distribution of surface conditions of the semiconductor wafers, specifically the distribution of the emissivity. It is used to compute the distribution pattern of the light intensity for implementing an essentially uniform distribution of the amount of light absorption of the article which is to be treated and which has been irradiated with light, and as a result to implement an essentially uniform temperature of the article to be treated during light irradiation in order to heat it such that the temperature distribution of the article to be treated during the heat treatment described above in (1) becomes essentially constant (see, steps S1, S2 according to FIG. 4).

In FIGS. 8, 9, & 10, the main controller MC sends a transport command signal to the transport unit controller 204 for transporting of one of the semiconductor wafers 600 stored in the cassette 201a to the positioning carrier 203 (step S102 in FIG. 9 and FIG. 10b). The transport unit controller 204 which has received the transport command signal drives the transport unit 202a, takes one of the semiconductor wafers 600 out of the cassette 201a, transports it to the positioning carrier 203 and sets it on the positioning carrier 203 (step S103 in FIG. 9, FIG. 10c). The main controller MC sends a positioning command signal to the positioning carrier 203 in order to position the direction of the orientation flat or a notch as a reference shape of the semiconductor wafer 600 placed on the positioning carrier 203 in a given direction (step S104 in FIG. 9, FIG. 10d).

The positioning carrier 203 determines the position and direction of the reference shape of the semiconductor wafer 600 and positions the direction of the reference shape of the semiconductor wafer 600 in a given direction (step S105 in FIG. 9, FIG. 10e). To determine the position of the reference shape, for example, an optical means, such as a semiconductor laser device or the like is used. Since the specific sequence of positioning is known from the prior art, it is not further described here.

The main controller MC sends a transport command signal to the transport unit controller 204 for transporting the semiconductor wafer 600 positioned by the positioning carrier 203 to the treatment frame 5 within the chamber 300 which includes the space S2 for heat treatment of the semiconductor wafer 600, and for the arrangement of the semiconductor wafer 600 in the treatment frame 5 (step S106 in FIG. 9, FIG. 10b). The transport unit controller 204 which has received the transport command signal drives the transport unit 202b, transports the semiconductor wafer 600 from the positioning carrier 203 and sets it on the treatment frame 5 (step S107 in FIG. 9, FIG. 10c). The transport unit 202b is operated such that during transport of the semiconductor wafer 600 and when it is placed on the treatment frame 5, the position of the reference shape of the pre-positioned semiconductor wafer 600 is stored and the reference shape of the semiconductor wafer 600 which has been placed on the treatment frame 5 assumes a given direction.

Figure 11:
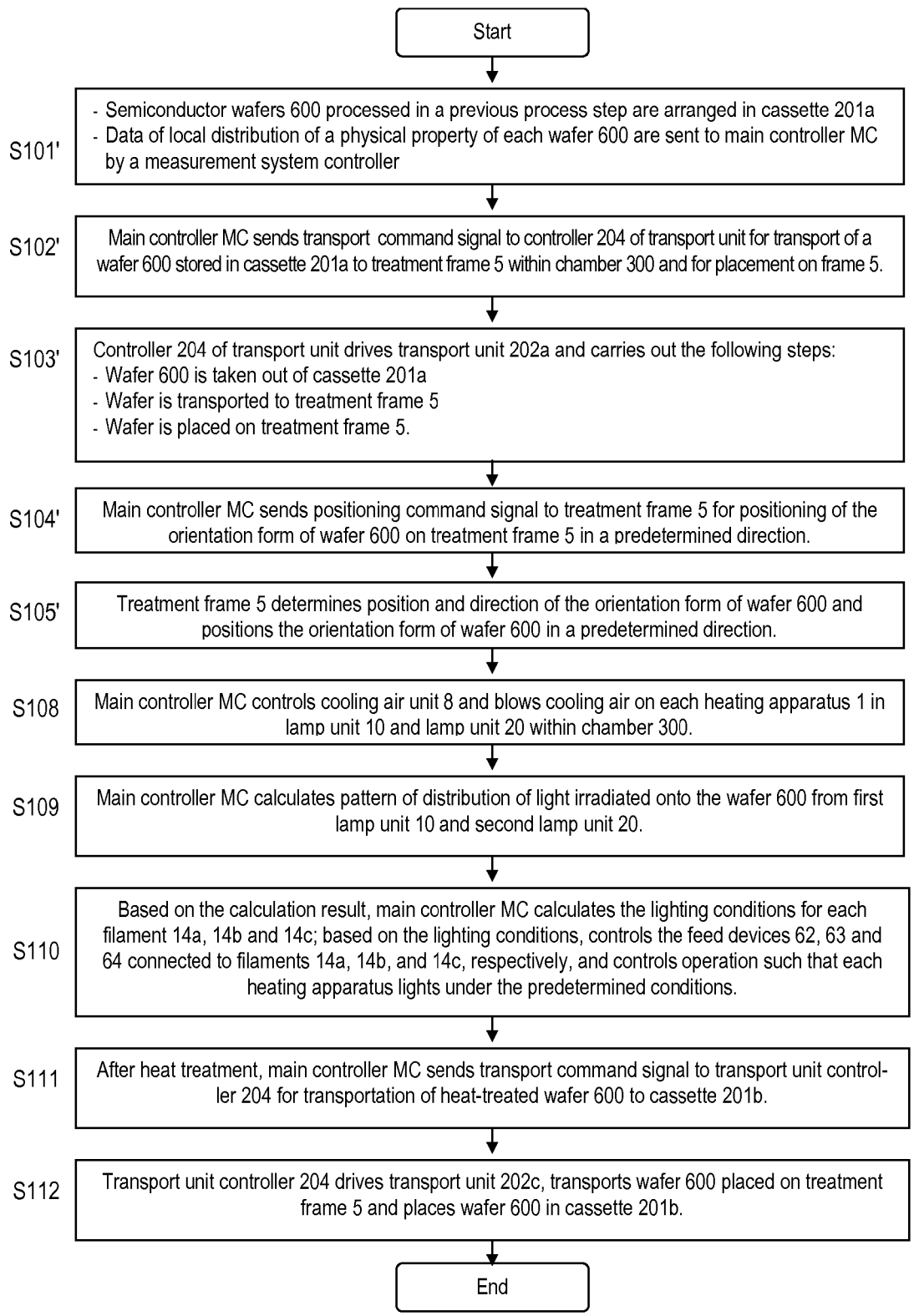
FIG. 11 is a schematic of one version of part of the flow chart shown in FIG. 9.

The positioning of the semiconductor wafer 600 can, furthermore, be performed only after placement on the treatment frame 5 by assigning the positioning function of the semiconductor wafer 600 to the treatment frame 5. In this case, neither the positioning carrier 203 nor the transport unit 202b is used, but the semiconductor wafer 600 is transported with the transport unit 202a to the treatment frame 5. The above described steps S102 to S107 are changed into the steps S102' to S105' described below as shown in FIG. 11. This means that the main controller MC in step S102' sends to the transport unit controller 204, a transport command signal to transport one of the semiconductor wafers 600 stored in the cassette 201a to the treatment frame 5 within the chamber 300 which includes the space S2 for heat treatment of the semiconductor wafer 600, and for arranging it in the treatment frame 5. The transport unit controller 204 which has received the transport command signal drives the transport unit 202a, takes one of the semiconductor wafers 600 out of the cassette 201a, transports it to the treatment frame 5 and sets it on the treatment frame 5 (step S103').

The main controller MC sends a positioning command signal to the treatment frame 5 in order to position the direction of the orientation flat or a notch as a reference shape of the semiconductor wafer 600 placed on the treatment frame 5 in a given direction (step S104'). The treatment frame 5 determines the position and direction of the reference shape of the semiconductor wafer 600 and positions the direction of the reference shape of the semiconductor wafer 600 in a given direction (step S105').

In the flow chart as shown in FIG. 9, the main controller MC controls the cooling air unit 8 and blows cooling air onto the respective heating apparatus 1 for the lamp units 10 and 20 within the chamber 300 (step S108 in FIG. 9, f in FIG. 8). The inside of the chamber 300, as was described above, is divided by the silica glass window 4 into a space for holding the lamp units 10, 20 (lamp unit holding space S1) and a space for treating the semiconductor wafer 600 (heat treatment space S2) in order to prevent cooling of the article 6 to be treated (semiconductor wafer 600) by the delivered cooling air. The cooling air flowing into the chamber 300 is blown out through an air blowout opening 83. The cooling air flows into the chamber 300 with consideration of the fact that the cooling air which has reached a high temperature by heat exchange does not conversely heat the respective heating apparatus. Feed and evacuation of the cooling air into the chamber 300 are constructed with consideration of the flow of the above described cooling air.

The main controller MC, based on the position direction of the reference shape of the semiconductor wafer 600 placed on the treatment frame 5 and based on the data of the local distribution of the physical property of the semiconductor wafer 600 which was received by the measurement system controller beforehand, computes the distribution pattern of the light intensity of the light emitted from the first lamp unit 10 and the second lamp unit 20 on the semiconductor wafer 600 for which the temperature of the semiconductor wafer 600 becomes uniform during heat treatment (step S109 in FIG. 9, FIG. 10g).

In the vicinity of the edge area of the semiconductor wafer 600, heat radiation often arises from the edge face. Since it also comes into contact with the treatment frame 5 which supports the semiconductor wafer 600, the heat often flows off, and as a result a temperature distribution often occurs. When the temperature distribution pattern in the vicinity of this edge area has been found by a prior study, the pattern of the temperature distribution of the vicinity of this edge area can be reflected in the computation of the distribution of the light intensity in step S109.

The main controller MC, based on the computation result of the above described distribution pattern of the light intensity, determines the lighting conditions of the filaments 14a, 14b, 14c of the respective heating apparatus 1 of the lamp units 10, 20. First, the intensity of the light emitted from the respective light emitting part (filaments 14a, 14b, 14c of the respective heating apparatus 1) of the above described lamp units 10, 20 is determined to implement the distribution pattern of the light intensity on the semiconductor wafer 600. The lighting conditions of the filaments 14a, 14b 14c of the respective heating apparatus 1 which correspond to the determined individual light intensity are determined. Based on the determined lighting conditions, the feed devices 62, 63, 64 which are connected individually to the filaments 14a, 14b, 14c are controlled, and thus, the respective heating apparatus is subjected to lighting control (step S110 in FIG. 9, FIG. 10h). The above described lighting control is effected such that the light emitted from the individual light emitting part of the respective heating apparatus has a given light intensity and on the semiconductor wafer 600, a given distribution pattern of the light intensity is implemented. Still more accurate temperature control is implemented when the temperature of the article which is to be treated and which is monitored by the thermometer 9 is fed back to the temperature controller 92 and the lighting conditions of the lamp units are corrected. This circumstance is described in item 2 "(2) Second embodiment of the heat treatment process" described below.

In the first lamp unit 10, as is shown, for example, in FIG. 12, above the semiconductor wafers 600, there are ten heating apparatus 1 (1a, 1b . . . 1j) parallel to one another with a given spacing in the direction perpendicular to the page of the drawings. In the second lamp unit 20, above the article 6 to be treated there are ten heating apparatus 1 (1k, 1l, . . . 1t) parallel to one another with a given spacing parallel to the page of the drawings, their being in contact with one another above the lamp unit 10 or being arranged away from one another.

For the arrangement of the respective heating apparatus, as was described above, the arrangement shown in FIG. 2 is undertaken. When in the respective filament of the heating apparatus 1 there is individually a feed device, the power source part 7 has sixty feed devices.

The heat treatment of the semiconductor wafer 600 proceeds largely through three processes, specifically raising the temperature of the semiconductor wafer, maintaining a constant temperature, and reducing it. The heating device 100, as the heat treatment device of the light irradiation type, irradiates the semiconductor wafers 600 which constitute the article to be treated, with light, the light intensity corresponding to these three processes. Therefore, lighting control of the respective heating apparatus in step S110 means a change of the intensity of the light emitted by the respective heating apparatus according to the above described three processes by the set distribution pattern of the light intensity on the semiconductor wafers 600 being maintained. Depending on the process, there are also cases in which when the temperature of the semiconductor wafers drops, all heating apparatus are switched off and the semiconductor wafers are subjected to natural cooling.

The main controller MC, after heat treatment of the semiconductor wafers 600 according to the given processes, sends a transport command signal to the transport unit controller 204 to transport a semiconductor wafer 600 which has been placed on the treatment frame 5 and which has already been heat-treated to the cassette 201b (step S111 in FIG. 9, FIG. 10b). The transport unit controller 204, which has received the transport command signal, drives the transport unit 202c, transports the semiconductor wafer 600 which has been placed on the treatment frame 5 to the cassette 201b and arranges it in the cassette 201b (step S112 in FIG. 9, FIG. 10c). Heat treatment of a semiconductor wafer 600 is completed by the above described sequence.

Furthermore, to increase the throughput of the heat treatment at the time of transport of the semiconductor wafer 600 from the positioning carrier 203 to the treatment frame 5 in the chamber 300 in step S106 and at the instant the semiconductor wafer 600 is placed on the treatment frame 5, transport of the next semiconductor wafer 600 from the cassette 201a to the positioning carrier 203 can start. This means that the treatment step 102 of the next semiconductor wafer 600 can also be carried out at this instant.

The above described "first embodiment of the heat treatment process" in the above described heating process relates to the specific sequences of the "case (1) of heating such that the temperature distribution of the article to be treated becomes essentially constant" and "(2) case of heating such that the article to be treated has the desired distribution of a physical property".

According to this sequence, corresponding to the local distribution of the physical property of the article to be treated, such as a semiconductor wafer or the like, which was measured beforehand, the distribution pattern of the intensity of the light emitted by the heat source onto the article to be treated is set. The lighting conditions of the respective heating apparatus of the lamp units are determined for implementing the set distribution pattern of light intensity, and based on the lighting conditions, the lamp units with at least one light emitting part are lighted by controlling the intensity of the light emitted from the respective light emitting part individually.

Therefore, in the case of an asymmetrical local distribution of the physical property to the shape of the substrate, control of the intensity of the light emitted by the lamp units is enabled according to a series of heat treatments such as an increase in the temperature of the article to be treated, maintaining a constant temperature, and reducing it, by a corresponding light intensity distribution being maintained on the article to be treated. It thus becomes possible to uniformly heat the article to be treated.

The vicinity of the edge area of the article to be treated, which is in contact with the treatment frame 5 which supports the semiconductor wafers 600 and in which a temperature distribution often occurs by heat radiation, in the above described "case (1) of heating such that the temperature distribution of the article to be treated becomes essentially constant" can be heat treated with a temperature distribution which has been made uniform, by the pattern of the temperature distribution of the vicinity of the edge area being studied beforehand, thus confirmed and that this temperature distribution pattern is reflected in the computation of the above described distribution pattern of the light intensity. In the above described "case (2) of heating such that the article to be treated has the desired distribution of the physical property," the vicinity of the edge area of the article to be treated can also be heat-treated by the above described given temperature distribution being maintained with high precision.

The above described first embodiment of the heat treatment process can furthermore also be applied to the above described "case (3) of heating according to the local distribution of the physical property of the raw material molecules in the space between the light emitting parts and the article to be treated." This means that the distribution pattern of the intensity of the light emitted from the heat source on the article to be treated can be set with consideration of the local distribution of a physical property of the above described raw material molecules. For example, in the case in which by heating the surface of the semiconductor wafer a film with an essentially uniform film thickness and composition is formed, the above described distribution pattern of the light intensity can be set in the sequence of steps S11 to S71 according to FIG. 7.

(b) Second Embodiment of the Heat Treatment Process

If still higher precision of temperature control is necessary, so-called control with feedback in which the temperature of the article being heated is in fact monitored, the temperature distribution is determined and based on this measurement result the lighting conditions of the lamp units are corrected, can be added to the above described sequence of heat treatment according to the first embodiment. For example, to execute lighting control of the lamp units such that the set distribution pattern of the light intensity is maintained, the power supplied to the respective filament of the respective heating apparatus is set to a given value. However, in the case in which there are individual differences between the individual filaments of the heating apparatus, the desired light intensity cannot always be obtained, even if the power supplied to the respective filament has been set to a given value. In this case, the distribution pattern of the light intensity on the article to be treated does not always agree completely with the set distribution pattern of light intensity.

When the property of transparency of the silica glass window 4 located between the lamp units 10, 20 and the article 6 to be treated has a nonuniformity, the distribution pattern of the light intensity on the article to be treated still does not always agree completely with the set distribution pattern of light intensity.

By introducing control with feedback against the adverse effect of temperature control on accuracy, as a result of this deviation of the distribution pattern of the light intensity and as a result of other factors, implementation of temperature control with still higher precision is enabled.

To implement the control with feedback used in the second embodiment of the heat treatment process, in the heating device 100, there are a temperature measurement part 91, a thermometer 9 and a temperature controller 92, as was described above. The respective components are described below.

As was described above, at least one temperature measurement part 91 is located bordering the article 6 to be treated or adjacent to it. The temperature measurement part 91 is, for example, a radiation thermometer or a thermocouple. The number and the arrangement of the temperature measurement parts 91 are established according to the dimensions of the article 6 to be treated. The information monitored by the temperature measurement part 91 according to the heat energy from at least one position of the article 6 to be treated is sent to the thermometer 9 which sends to the temperature controller 92 electrical signals which correspond to the information received from the temperature measurement part 91.

The temperature controller 92 based on temperature information at least one position of the article 6 to be treated which has been received from the thermometer 9 determines the temperature on the measurement points of the article 6 to be treated. For the temperature controller 92, the setpoint temperature during the heating process is set beforehand according to the type of article to be treated and the amount of power supply is controlled which is supplied from the feed devices (62, 63, 64 . . . ) of the power source part 7 to the respective heating apparatus 1 of the lamp units 10, 20, such that the temperature of the article 6 to be treated agrees with this setpoint temperature. The temperature during the heating process of the article 6 to be treated is fixed at the setpoint temperature, as is moreover the temperature distribution within a given region.

As was described above, the radiation thermometer as a result of the varied emissivity of the object to be measured exhibits apparent measurement results which differ from the real temperature. In the case of using a radiation thermometer as the temperature measurement part 91, the temperature controller 92, based on the apparent measurement results, exercises control with feedback. This means that, during heat treatment, an unwanted temperature distribution occurs in the article to be treated. Emissivity data at the measurement points of the article 6 to be treated are input into the temperature controller 92. Therefore, the temperature controller 92, based on these data of emissivity, corrects the temperature information at least one position of the article 6 to be treated which has been received from the thermometer 9.

Figure 13:
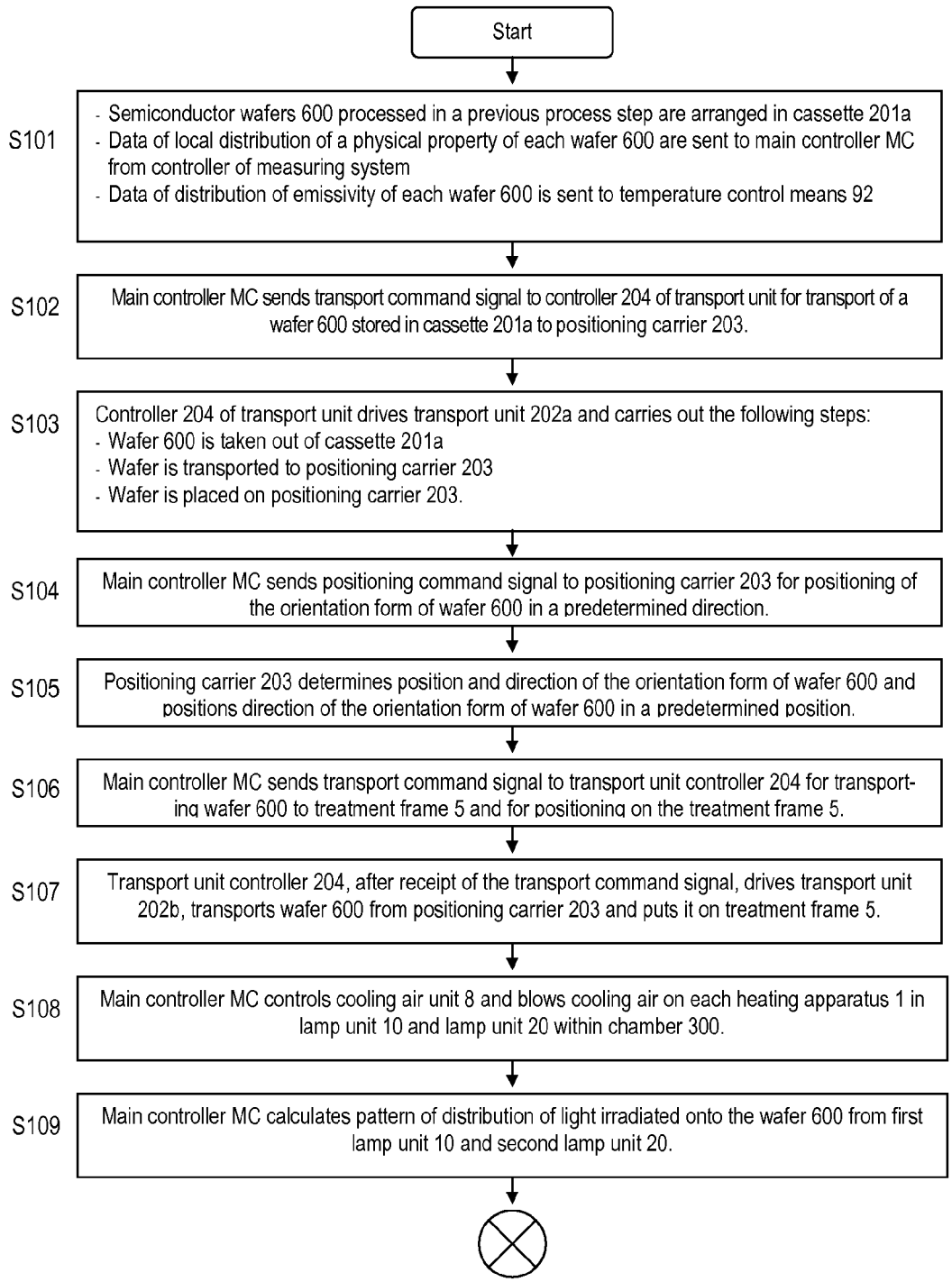
FIG. 13 is a flow chart of a second embodiment of the heat treatment process.
Figure 14:
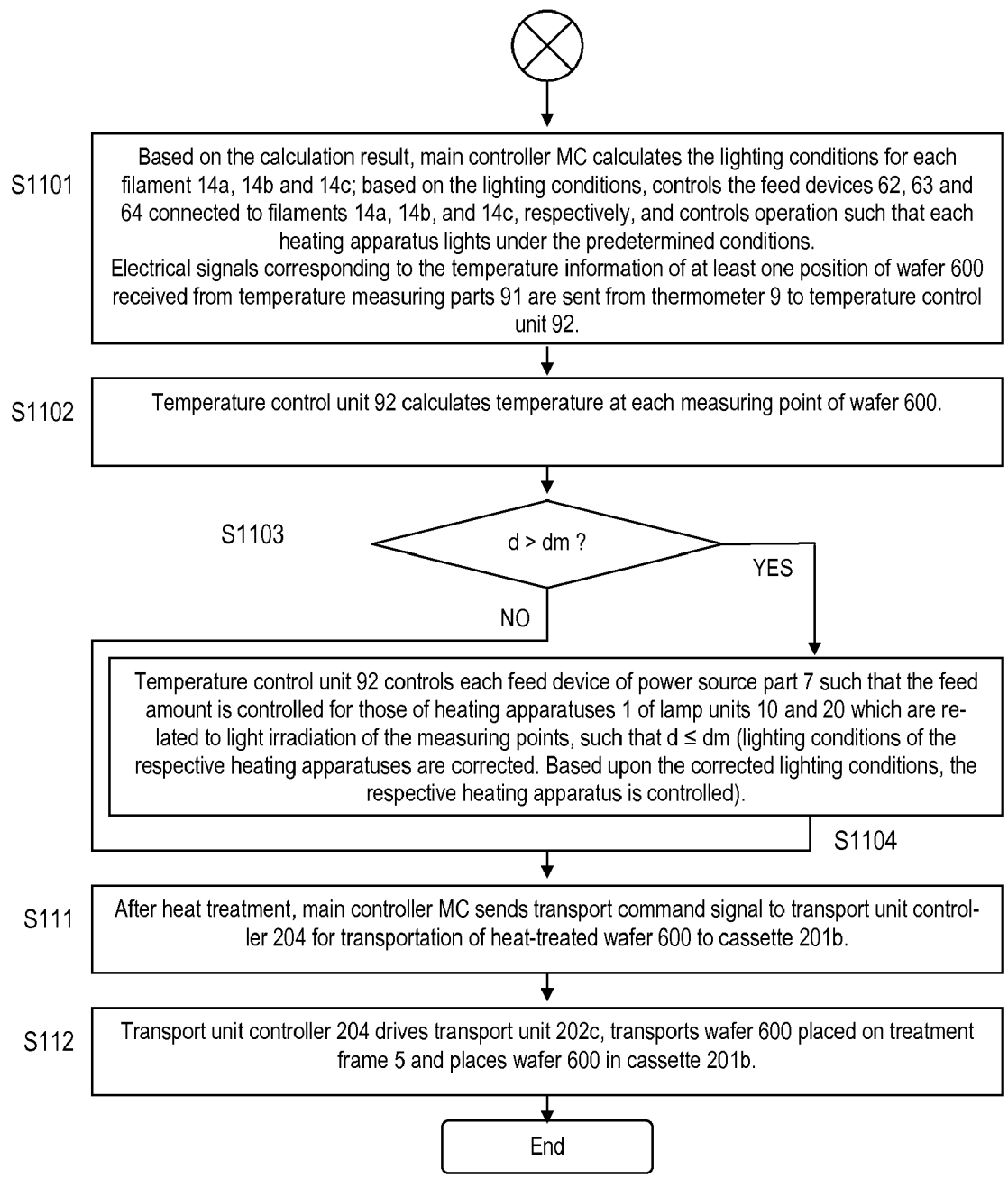
FIG. 14 is a continuation of the flow chart of FIG. 13 of the second embodiment of the heat treatment process.
Figure 15:
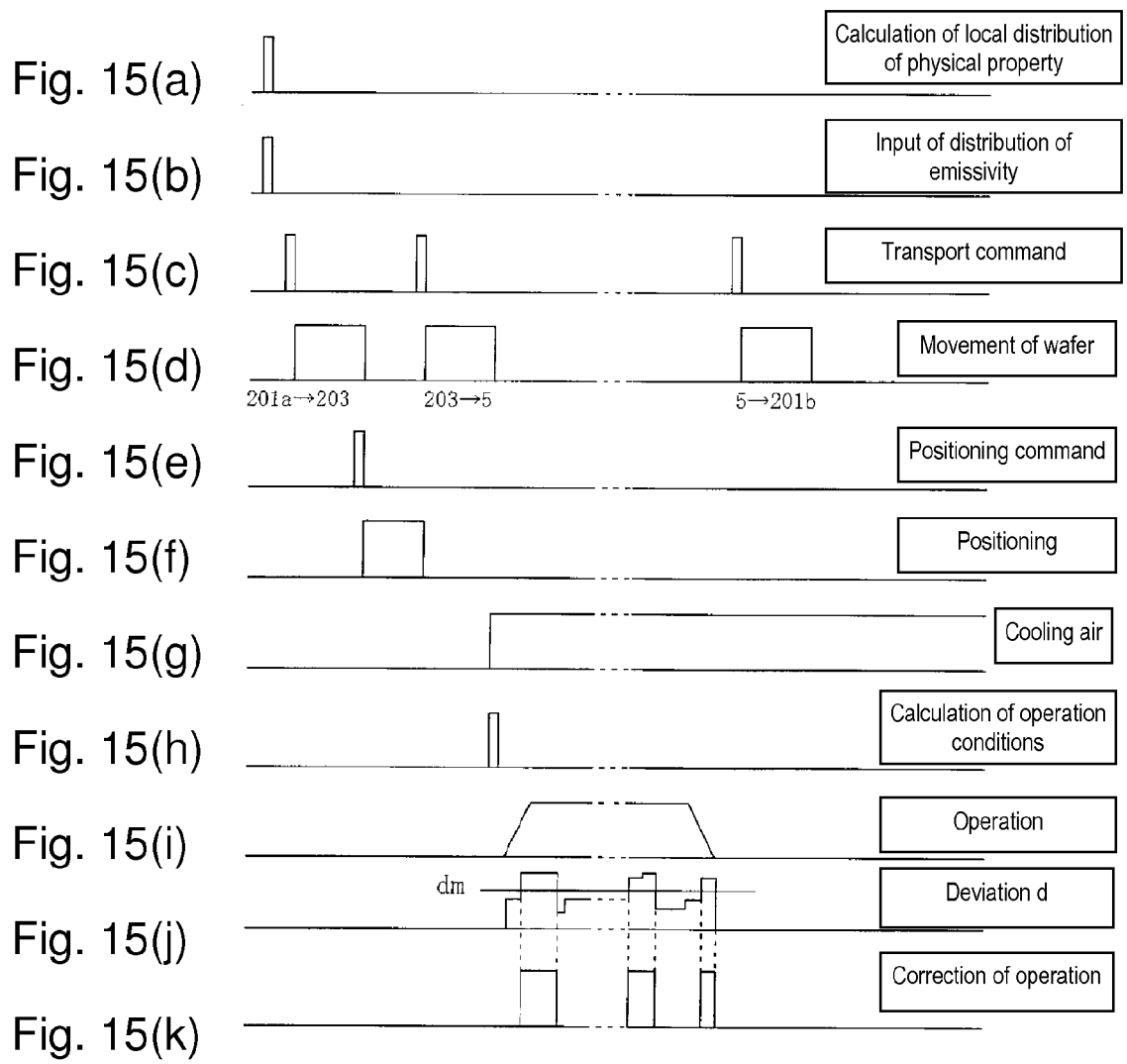
FIGS. 15(a) to 15(k) are time charts of the second embodiment of the heat treatment process.

The second embodiment of the heat treatment process is described using the controller diagram according to FIG. 8, the flow chart according to FIGS. 13 & 14 and the time chart according to FIG. 15. For the arrangement of the respective heating apparatus 1 of the lamp units 10, 20, for example, the arrangement shown in FIG. 2 is used.

In FIG. 8, the semiconductor wafers 600, as the articles 6 which are to be treated and which has passed through the previous process step, are transported to the heating device 100 by a transport device (not shown) and are arranged in a cassette 201a (step S101 in FIG. 13). In this connection, the data of the local distribution of the physical property of the transported semiconductor wafers 600 are collected by a means for measuring the physical property (not shown). These data of the local distribution of the physical property are related to the position of the orientation flat or the notch as the reference shape of the semiconductor wafer.

The individual data of the local distribution of a physical property of the respective semiconductor wafer 600 located in the cassette 201a are sent by the measurement system controller (not shown) of the means for measuring the physical property to the main controller MC (FIGS. 15a & 15b).

In this connection, as was described above, if the local distribution of a physical property is an emissivity distribution, the data of the emissivity distribution are sent from the above described measurement system controller to the temperature controller 92 as well. When the local distribution of a physical property taken beforehand is not the emissivity distribution, the emissivity distribution of the semiconductor wafers which constitute the articles to be treated is also collected by the means for measuring the distribution of the physical property which is not shown in the drawings, and sent to the temperature controller 92 by the above described measurement system controller. These data of the emissivity distribution are related to the position of the orientation flat or the notch as the reference shape of the semiconductor wafer.

The sequence of positioning of the semiconductor wafers 600 which have undergone the preceding process step and which are located in the cassette 201a, and the sequence of placing these semiconductor wafers 600 on the treatment frame 5 until computation of the distribution of the light intensity on the semiconductor wafers 600 by the main controller MC (steps S102 to S109 according to FIG. 13, FIGS. 15c to 15h) are identical to steps S102 to S109 and FIGS. 10b to 10g of the sequence of heat treatment according to the first embodiment and are therefore not further described.

In step S1101, which follows step S109, the main controller MC based on the measurement results determines the lighting conditions of the filaments 14a, 14b, 14c of the heating apparatus 1 of the lamp units 10, 20. Based on the determined lighting conditions the feed devices 62, 63, 64 which are connected individually to the filaments 14a, 14b, 14c are controlled and operation is controlled such that the respective heating apparatus is operated under given lighting conditions. At the same time, the thermometer 9 sends to the temperature controller 92 electrical signals according to the temperature information at least one position of the semiconductor wafer 600 which has been received from the temperature measurement part 91. Based on the temperature information, at least one position of the semiconductor wafer 600 which has been received from the thermometer 9, the temperature controller 92 computes the temperature at the respective measurement point of the semiconductor wafer 600 (step S1102 in FIG. 14). In this connection, the temperature controller 92, based on the emissivity data received in the above described step S101 from the measurement system controller at the measurement points of the article 6 to be treated, corrects the temperature to be computed at the respective measurement point of the semiconductor wafer 600. In the temperature controller 92, according to the type of article to be treated, the setpoint temperature at the respective measurement point during the heating process is set beforehand. The temperature controller 92 checks whether the deviation d between the temperature at the respective measurement point and the above described setpoint temperature has exceeded a tolerance of dm or not (step S1103 according to FIG. 14).

When, as a result of testing, there are measurement points at which the above described deviation d has exceeded the tolerance dm, the temperature controller 92 controls the respective feed device of the power source part 7 such that the amount of power is controlled which is supplied to those heating apparatus among the heating apparatus 1 of the lamp units 10, 20 which relate to the light irradiation of these measurement points, so that the above described deviation d at these measurement points lies within the tolerance of dm. This means that the lighting conditions of the respective heating apparatus are corrected and the respective heating apparatus is subjected to lighting control (step S1104 according to FIG. 14, FIGS. 15j & 15k).

Furthermore, the arrangement can also be such that, in step S1104, it is not the temperature controller 92 which controls the respective feed device of the power source part 7, but the main controller MC which controls it. In this case, the temperature controller 92 sends to the main controller MC the test result of the deviation between the temperature at the respective measurement point and the above described setpoint temperature. The main controller MC, which has received the test result, exercises control such that the above described deviation at these measurement points is within tolerance. Specifically, the respective feed device of the power source part 7 is controlled such that the amount of power supply to those heating apparatus among the heating apparatus 1 of the lamp units 10, 20 which relate to the light irradiation of these measurement points is controlled. This means that the lighting conditions of the respective heating apparatus are corrected so that the corrected lighting conditions are determined and the respective heating apparatus is subjected to lighting control based on these corrected lighting conditions.

When, as a result of testing, there are no measurement points at which the above described deviation d has exceeded the tolerance dm, the lighting conditions of the respective heating apparatus are not changed, but step S111 follows after heat treatment of the semiconductor wafers 600 according to the given processes has been completed.

After completion of heat treatment, the steps up to arrangement of the already heat-treated semiconductor wafers 600 in the cassette 201b are identical to steps S111 to S112 in the heat treatment process according to the first embodiment, so that they are not further described.

During light irradiation, the temperature information of the article to be treated is monitored by the heat treatment process according to the second embodiment, based on the monitoring result, the intensity of the light emitted by the lamp units is controlled with feedback so that the article to be treated can be uniformly heated with greater precision than in the heat treatment process according to the first embodiment.

Furthermore, since, based on the data of emissivity at the measurement points of the article to be treated, the measured values which have been obtained by the radiation thermometer as a monitor are corrected, control with feedback can be exercised with high precision. In the process of maintaining a constant temperature with a relatively long process duration, as compared to the other two heating processes, specifically the temperature increase of the semiconductor wafer and the drop of the constant temperature, temperature control with feedback is effectively used by the above described temperature controller 92.

(c) Third Embodiment of the Heat Treatment Process

When it is sufficient for collecting the data of the local distribution of a physical property if the data of the local distribution of a physical property are collected in any semiconductor wafer from a lot of semiconductor wafers, as is described below, there are cases in which the data of the local distribution of a physical property can be collected without using a means for measuring the distribution of the physical property.

Using the case in which the article to be treated is a semiconductor wafer, for example, the sequence of heating of the article to be treated according to the heating process in accordance with the invention is described below using the controller diagram show in FIG. 8, the flow chart shown in FIGS. 16 & 17 and the time chart shown in FIG. 18. The arrangement shown by way of example in FIG. 2 is implemented for the arrangement of the respective heating apparatus 1 of the lamp units 10 and 20.

Figure 16:
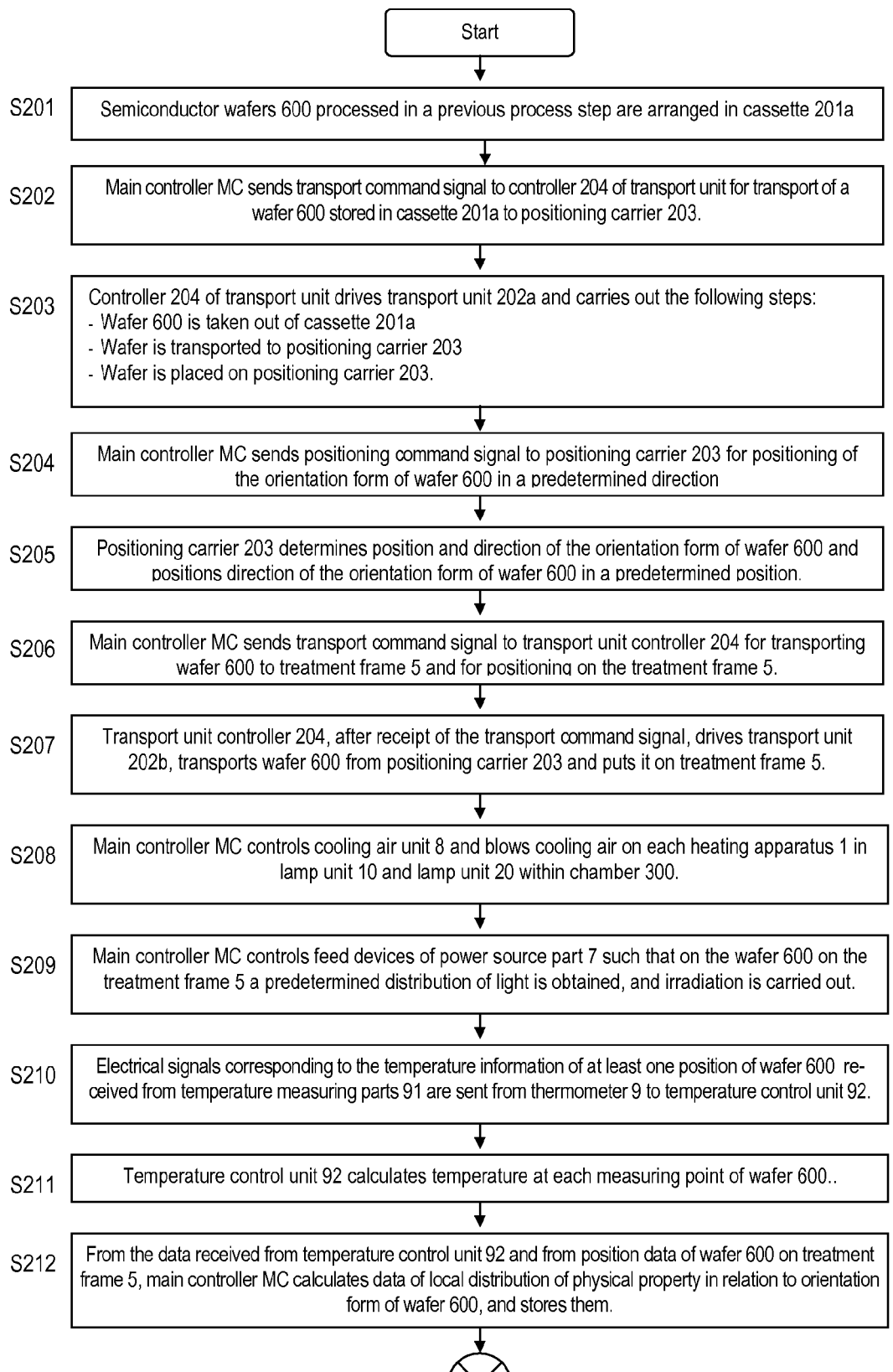
FIG. 16 is a flow chart of a third embodiment of the heat treatment process.

In FIG. 8, the semiconductor wafers 600, as the articles 6 which are to be treated and which have passed through a previous process step, are transported by a transport device (not shown) to the heating device 100 and are located in the cassette 201*a* (step S201 in FIG. 16).

The main controller MC sends a transport command signal to the transport unit controller 204 for transporting of one of the semiconductor wafers 600 stored in the cassette 201*a* to the positioning carrier 203 (step S202). The transport unit controller 204 which has received the command signal for transport drives the transport unit 202*a*, takes one of the semiconductor wafers 600 out of the cassette 201*a*, transports it to the positioning carrier 203 and sets it on the positioning carrier 203 (step S203 in FIG. 16, FIGS. 18*a* & 18*b*).

The main controller MC sends a positioning command signal to the positioning carrier 203 in order to position the direction of the orientation flat or a notch as a reference shape of the semiconductor wafer 600 which has been placed on the positioning carrier 203 in a given direction (step S204 in FIG. 16, FIG. 18*c*).

The positioning carrier 203 determines the position and direction of the reference shape of the semiconductor wafer 600 and positions the direction of the reference shape of the semiconductor wafer 600 in a given direction (step S205 in FIG. 16, FIG. 18*d*). To determine the position of the reference shape, for example, an optical means, such as a semiconductor laser device or the like is used. Since the specific sequence of positioning is known from the prior art, it is not further described here.

The main controller MC transports the semiconductor wafer 600 which has been positioned by the positioning carrier 203 to the treatment frame 5 within the chamber 300 which includes the space S2 for heat treatment of the semiconductor wafer 600, and sends a transport command signal to the transport unit controller 204 for the arrangement of the semiconductor wafer 600 in the treatment frame 5 (step S206 in FIG. 16, FIG. 18*a*). The transport unit controller 204 which has received the transport command signal drives the transport unit 202*b*, transports the semiconductor wafer 600 from the positioning carrier 203 and sets it on the treatment frame 5 (step S207 in FIG. 16). The transport unit 202*b* is operated such that, during transporting of the semiconductor wafer 600 and when it is placed on the treatment frame 5, the position of the reference shape of the pre-positioned semiconductor wafer 600 is stored and the reference shape of the semiconductor wafer 600 which has been placed on the treatment frame 5 assumes a given direction.

Figure 19:
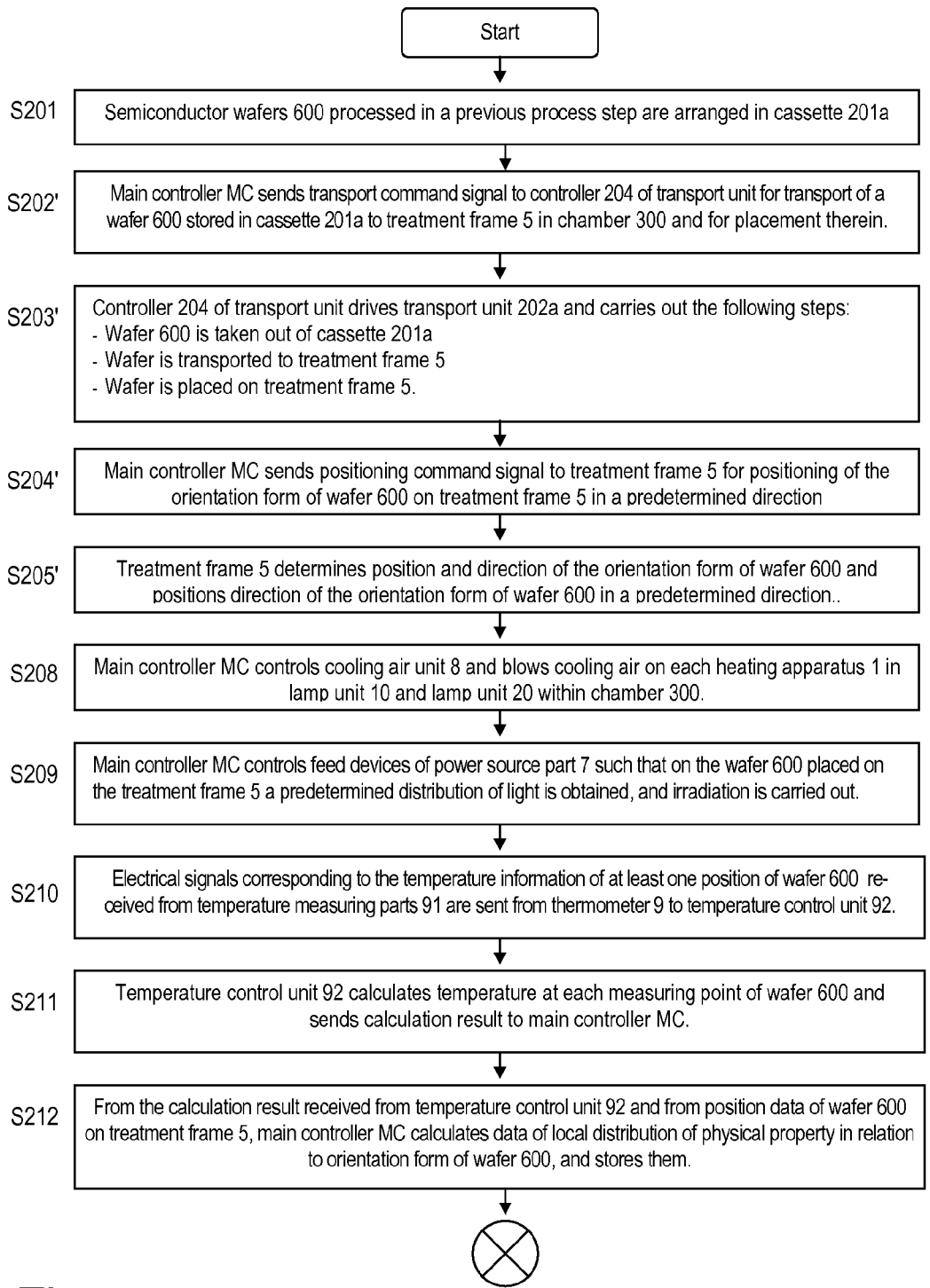
FIG. 19 is a schematic of one version of part of the flow chart as shown in FIG. 16.

Furthermore, positioning of the semiconductor wafer 600 can be performed only after placement on the treatment frame 5 by assigning the positioning function of the semiconductor wafer 600 to the treatment frame 5. In this case, neither the positioning carrier 203 nor the transport unit 202*b* is used, but the semiconductor wafer 600 is transported by the transport unit 202*a* to the treatment frame 5. The above described steps S202 to S207 are changed into the steps S202' to S205' described below as shown in FIG. 19.

This means that the main controller MC, in step S202', sends to the transport unit controller 204 a transport command signal to transport a semiconductor wafer 600 stored in the cassette 201*a* to the treatment frame 5 within the chamber 300 which includes the space S2 for heat treatment of the semiconductor wafer 600, and to place it in the treatment frame 5. The transport unit controller 204 which has received the transport command signal drives the transport unit 202*a*, takes one of the semiconductor wafers 600 out of the cassette 201*a*, transports it to the treatment frame 5 and sets it on the treatment frame 5 (step S203').

The main controller MC sends a positioning command signal to the treatment frame 5 in order to position the direction of the orientation flat or a notch as a reference shape of the semiconductor wafer 600 which has been placed on the treatment frame 5 in a given direction (step S204'). The treatment frame 5 determines the position and direction of the reference shape of the semiconductor wafer 600 and positions the direction of the reference shape of the semiconductor wafer 600 in a given direction (step S205').

In the flow chart as shown in FIG. 16, the main controller MC controls the cooling air unit 8 and blows cooling air onto the respective heating apparatus 1 for the lamp units 10, 20 within the chamber 300 (step S208 in FIG. 16, FIG. 18*d*). The inside of the chamber 300 is divided by the silica glass window 4 into a space for holding the lamp units 10, 20 (lamp unit holding space S1 according to FIG. 8) and a space for treating the semiconductor wafer 600 (heat treatment space S2 according to FIG. 8) in order to prevent cooling of the article 6 to be treated by the delivered cooling air. The cooling air delivered into the chamber 300 is blown out through an air blowout opening 83. The cooling air flows into the chamber 300 with consideration of the fact that the cooling air which has reached a high temperature by heat exchange does not conversely heat the respective heating apparatus. Feed and evacuation of the cooling air into the chamber 300 are therefore produced with consideration of the flow of the above described cooling air.

The main controller MC controls the feed devices 62, 63, 64 of the power source part 7 which are each connected individually to the filaments 14*a*, 14*b*, 14*c* of the heating apparatus of the first lamp unit 10 and of the second lamp unit 20 such that the light intensity distribution on the semiconductor wafer 600 placed on the treatment frame 5 becomes a given one (for example, a uniform light intensity distribution), and irradiates it with light (step S209 according to FIG. 16, in FIG. 18*g*).

The thermometer 9 sends to the temperature controller 92 electrical signals which correspond to the temperature information at least one position of the semiconductor wafer 600 which has been received by the temperature measurement part 91 (step S210). In this connection, the temperature measurement part 91 should be one with measurement temperature information which is not influenced by the emissivity distribution of the article to be treated. For example, a thermocouple is used for it.

The temperature controller 92 based on the temperature information at least one position of the semiconductor wafer 600 which has been received by the thermometer 9 computes the temperature at the respective measurement point of the semiconductor wafer 600 and sends the computation result to the main controller MC (S211 according to FIG. 16). Based on the computation result of the temperature at the respective measurement point of the semiconductor wafer 600 which has been received from the temperature controller 92, and based on position information of the semiconductor wafer 600 which has been placed and positioned on the treatment frame 5, the main controller MC computes and stores the data of the local distribution of a physical property which are related to the position of the orientation flat or the notch as the reference shape of the semiconductor wafer (step S212, FIG. 18*h*).

Figure 17:
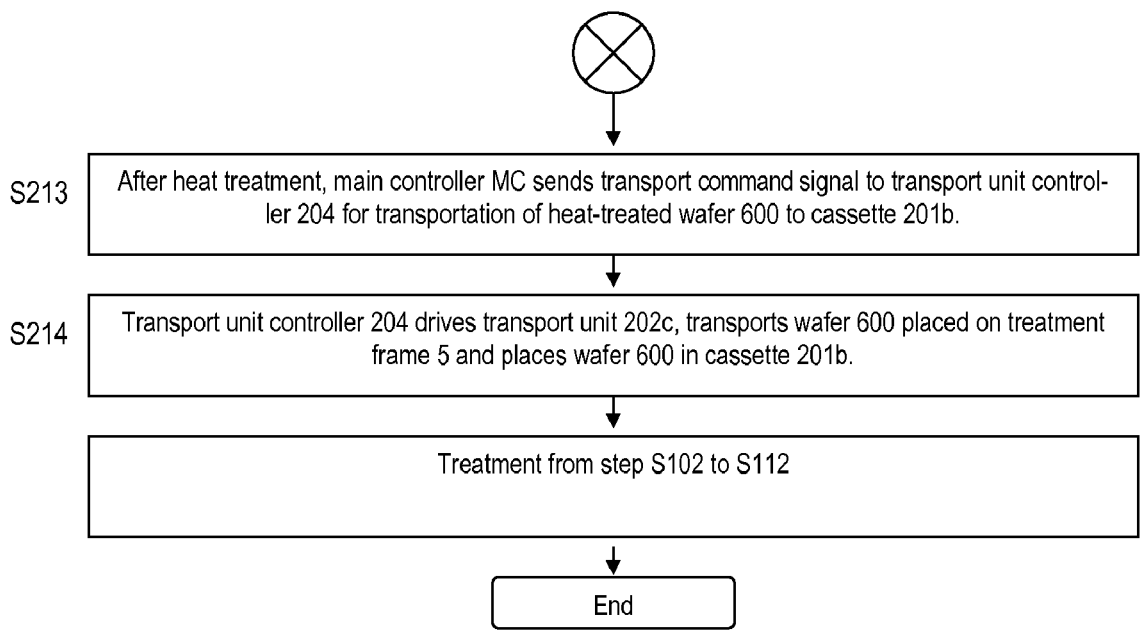
FIG. 17 is a continuation of the flow chart of FIG. 16 of the third embodiment of the heat treatment process.
Figure 18:
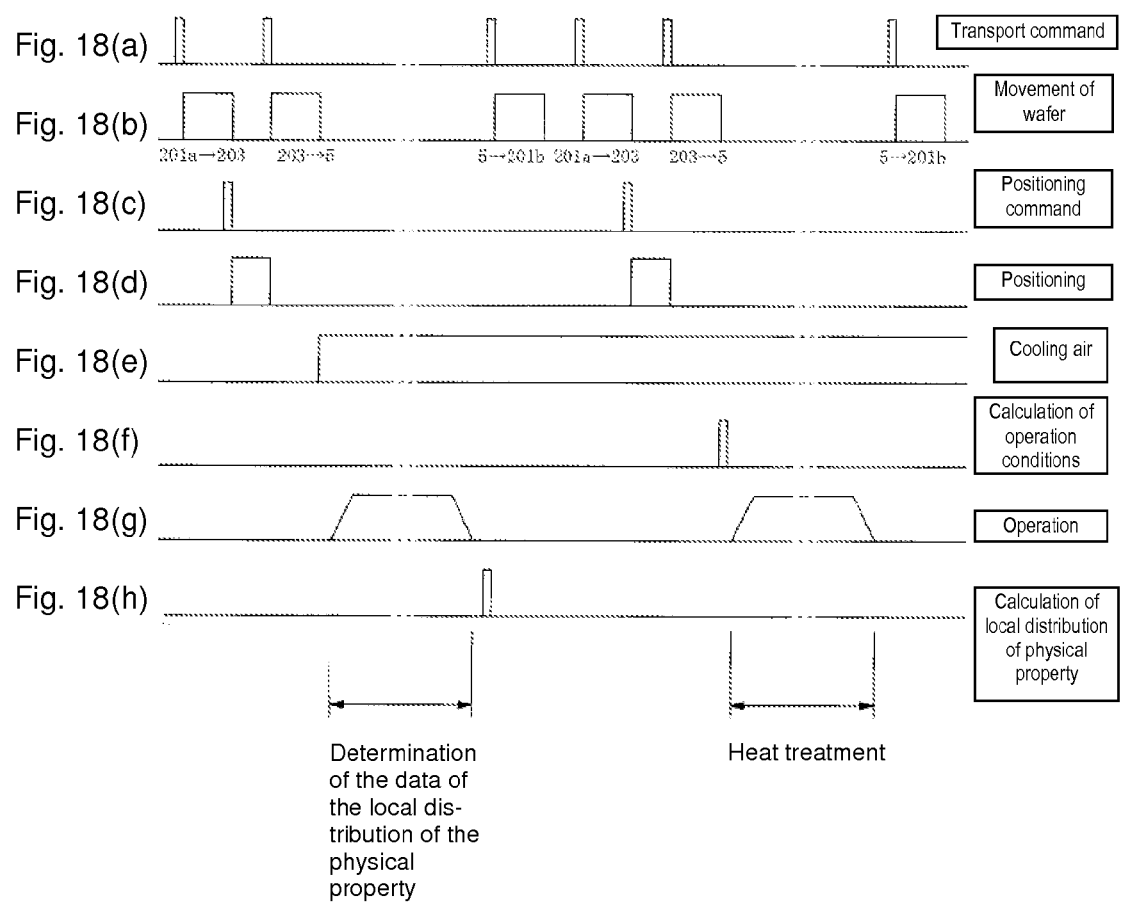
FIG. 18(a) to 18(h) are time charts of the third embodiment of the heat treatment process.

After completing the collection of the data of the local distribution of a physical property of the semiconductor wafer 600, the main controller MC sends a transport command signal to the transport unit controller 204 for transport of the semiconductor wafer 600 which has been placed on the treatment frame 5 to the cassette 201*b* (step S213 according to FIG. 17). The transport unit controller 204 which has received the transport command signal drives the transport unit 202*c*, transports the semiconductor wafer 600 which has been placed on the treatment frame 5 to the cassette 201*b* and places it in the cassette 201*b* (step S214 in FIG. 17).

From this point on, using the data of the local distribution of a physical property which were obtained in step S212, the heat treatment of the remaining semiconductor wafers 600 stored in the cassette 201*a* is performed (FIGS. 18*b*, 18*c*, 18*f* and 18*g*). This means that treatments are performed starting with step S102 according to FIG. 9 and FIG. 13 which was described in the heat treatment process according to the first or second embodiment.

According to the third embodiment of the heat treatment process, in fact, any individual semiconductor wafer is irradiated with light at a constant light intensity distribution, and the data of the local distribution of the physical property are collected so that data of the local distribution of a physical property are collected without using the means for measuring the distribution of the physical property.

The heating device of the light radiation type used for carrying out the invention based on the above described heat treatment process according to the first, second or third embodiment need not be the device shown in FIG. 1. This means that use of the lamp unit described in JP 2002-203804 A (U.S. Patent Application Publication 2004/0112885 A1) is not impossible, in spite of disadvantages in practice.

Furthermore, a lamp unit with several filament lamps of the single-end type can be used, in which light emerges mainly from the end opposite the hermetically sealed portion. For example, a lamp unit can also be used which consists of several filament lamps of the single-end type which are arranged such that the respective light exit part is matched to the shape of the article to be treated and in which feed of the respective filament lamp can be individually controlled.

Since this lamp unit, for example, as compared to the lamp units 10, 20 shown in FIG. 12 using the heating apparatus 1 shown in FIG. 2, has a lower light intensity of the light exit point, the operating power increases. Furthermore, since the filaments often deform in the direction of the force of gravity, there is the tendency for the service life of the lamp units to be shorter than in the above described lamp units 10, 20.

What we claim is:

1. Light irradiation heating process using a light irradiation heating device which has lamp units with at least one light emitting part and in which the intensity of the light emitted from the each light emitting part can be controlled individually, comprising the steps of:
    (a) measuring the following local distributions:
        the local distribution of a physical property of raw material molecules in a space between the at least one light emitting part of the lamp units and the article to be treated,
    (b) determining the pattern of the distribution of the light intensity on the article to be treated based on measurements obtained by said measuring step to impart a desired physical property to the article which has been treated by light heating,
    (c) determining a respective intensity of the light emitted from the above described at least one light emitting part according to the pattern of the light intensity determined in the preceding step (b), and
    individually controlling light intensity from the at least one light emitting part of the lamp units so as to irradiate the article to be treated with light in accordance with the intensity of the light emitted from the respective light emitting part determined in the preceding step(c).

2. Light irradiation heating process, using a light irradiation heating device which has lamp units with at least one light emitting part and in which the intensity of the light emitted from the each light emitting part can be controlled individually, comprising the steps of:
    (a) measuring the following local distributions:
        the local distribution of a physical property of the article to be treated
        the local distribution of a physical property of raw material molecules in a space between the at least one light emitting part of the lamp units and the article to be treated,
    (b) determining the pattern of the distribution of the light intensity on the article to be treated based on measurements obtained by said measuring step to impart a desired physical property to the article which has been treated by light heating,
    (c) determining a respective intensity of the light emitted from the above described at least one light emitting part according to the pattern of the light intensity determined in the preceding step (b), and
    individually controlling light intensity from the at least one light emitting part of the lamp units so as to irradiate the article to be treated with light in accordance with the intensity of the light emitted from the respective light emitting part determined in the preceding step (c),
    wherein said local distribution of the physical property measured is a distribution of the emissivity of the article to be treated, wherein, based the distribution of emissivity measured, the entire surface of the article to be treated is subjected to uniform heat absorption, and wherein the distribution pattern of the light intensity on the article to be treated is set such that the temperature distribution of the article to be treated is kept essentially uniform during light irradiation.

3. Light irradiation heating process using a light irradiation heating device which has lamp units with at least one light emitting part and in which the intensity of the light emitted from the each light emitting part can be controlled individually, comprising the steps of:
    (a) measuring at least one of the following local distributions:
        the local distribution of a physical property of the article to be treated
        the local distribution of a physical property of raw material molecules in a space between the at least one light emitting part of the lamp units and the article to be treated,
    (b) determining the pattern of the distribution of the light intensity on the article to be treated based on measurements obtained by said measuring step to impart a desired physical property to the article which has been treated by light heating,
    (c) determining a respective intensity of the light emitted from the above described at least one light emitting part according to the pattern of the light intensity determined in the preceding step (b), and
    individually controlling light intensity from the at least one light emitting part of the lamp units so as to irradiate the article to be treated with light in accordance with the intensity of the light emitted from the respective light emitting part determined in the preceding step (c), wherein said local distribution of the physical property is the density distribution of dopant ions which have been implanted by an ion implantation process in the article to be treated before heating, wherein, based on the density distribution of the dopant ions measured, the temperature distribution of the article to be treated during light irradiation is determined to a given distribution, and wherein based on the temperature distribution determined, the distribution pattern of the light intensity on the article to be treated is set such that the treated article has an essentially uniform sheet resistance in the treated surface.

4. Light irradiation heating process using a light irradiation heating device which has lamp units with at least one light emitting part and in which the intensity of the light emitted from the each light emitting part can be controlled individually, comprising the steps of:
  (a) measuring the local distribution a physical property of the article to be treated
  (b) determining the pattern of the distribution of the light intensity on the article to be treated based on measurements obtained by said measuring step to impart a desired physical property to the article which has been treated by light heating,
  (c) determining a respective intensity of the light emitted from the above described at least one light emitting part according to the pattern of the light intensity determined in the preceding step (b), and
  individually controlling light intensity from the at least one light emitting part of the lamp units so as to irradiate the article to be treated with light in accordance with the intensity of the light emitted from the respective light emitting part determined in the preceding step (c), wherein the local distribution of the physical property of the article to be treated is measured for an arbitrary one of the articles of one lot.

5. Light irradiation heating process in accordance with claim 1, wherein the local distribution of the physical property of the raw material molecules to be measured is the distribution of the reactant gas for film formation.

6. Light irradiation heating process in accordance with claim 5, wherein the local distribution is determined by measuring a distribution of the film thickness of a film which has been formed on a surface of a heat-treated dummy article without using a distribution pattern which takes into account the local distribution of the physical properties of the article to be treated.

7. Light irradiation heating process using a light irradiation heating device which has lamp units with at least one light emitting part and in which the intensity of the light emitted from the each light emitting part can be controlled individually, comprising the steps of:
  (a) locating several dummy articles which are to be treated in a reactant gas with raw material molecules for film formation, and individually heating the dummy articles under conditions of essentially the same orientation and positions and a uniform temperature distribution at temperatures which differ for the dummy articles to be treated, and forming a film on the respective dummy article to be treated;
  (b) measuring the thickness distribution of the film formed on the surface of the respective dummy article, and based thereon, determining the local distribution of the physical property of the above described raw material molecules;
  (c) determining the respective film formation rate for each of the dummy articles at any identical locations;
  (d) based on the respective film formation rate determined in step (c), determining the temperature dependency of the film formation rate at the coinciding locations of the dummy articles;
  (e) based on the film thickness distribution and the temperature dependency of the film formation rate determined in step (d), determining the distribution pattern of the light intensity on the article to be treated which leads to the film thickness distribution of the film formed on the surface of the article to be treated becoming uniform;
  (f) based on the distribution pattern of light intensity determined in step (e), determining the respective intensity of the light emitted from the at least one light emitting part of the lamp units; and
  (g) based on the respective intensity of the light emitted from the at least one light emitting part of the lamp units determined in step (f), individually controlling the intensity of the light emitted from each light emitting part and irradiating the respective article to be treated with light emitted.

\* \* \* \* \*